(12) United States Patent
Hermoso et al.

(10) Patent No.: US 11,095,296 B2
(45) Date of Patent: Aug. 17, 2021

(54) PHASE MODULATOR HAVING FRACTIONAL SAMPLE INTERVAL TIMING SKEW FOR FREQUENCY CONTROL INPUT

(71) Applicant: Innophase, Inc., San Diego, CA (US)

(72) Inventors: Sara Munoz Hermoso, San Diego, CA (US); Per Konradsson, Järfälla (SE); Yang Xu, San Diego, CA (US)

(73) Assignee: INNOPHASE, INC., San Diego, CA (US)

( * ) Notice: Subject to any disclaimer, the term of this patent is extended or adjusted under 35 U.S.C. 154(b) by 0 days.

(21) Appl. No.: 16/890,771

(22) Filed: Jun. 2, 2020

(65) Prior Publication Data
US 2020/0295769 A1     Sep. 17, 2020

Related U.S. Application Data

(63) Continuation-in-part of application No. 16/125,510, filed on Sep. 7, 2018, now Pat. No. 10,840,921.
(Continued)

(51) Int. Cl.
*H03L 7/099*     (2006.01)
*H03B 5/12*      (2006.01)

(52) U.S. Cl.
CPC ......... *H03L 7/0991* (2013.01); *H03B 5/1212* (2013.01)

(58) Field of Classification Search
CPC .................................................... H03L 7/0991
(Continued)

(56) References Cited

U.S. PATENT DOCUMENTS 4,271,412 A    6/1981  Glass et al.
4,322,819 A    3/1982  Hyatt
(Continued)

FOREIGN PATENT DOCUMENTS

CN     110324036 A    10/2019
EP       1187313 A1    3/2002
(Continued)

OTHER PUBLICATIONS

Winoto, Renaldi, et al., "A 2×2 WLAN and Bluetooth Combo SoC in 28nm CMOS with On-Chip WLAN Digital Power Amplifier, Integrated 2G/BT SP3T Switch and BT Pulling Cancelation", IEEE International Solid-State Circuits conference, ISSCC 2016, Session 9.4, High-Performance Wireless, Feb. 2, 2016, 170-172 (3 pages).
(Continued)

*Primary Examiner* — Joseph Chang
(74) *Attorney, Agent, or Firm* — Invention Mine LLC

(57) ABSTRACT

An example method in accordance with some embodiments includes: determining an output frequency control word (FCW) having a plurality of bits, the output FCW being configured to control an oscillator, the oscillator including a plurality of capacitor banks, the plurality of capacitor banks respectively corresponding to the plurality of bits of the output FCW; storing the output FCW in a clocked delay cell; providing an input clock to the clocked delay cell, wherein the input clock is provided to delay the output FCW by an amount of delay; and, in accordance with the input clock, releasing the delayed output FCW from the clocked delay
(Continued)

cell, and respectively applying the plurality of bits of the delayed output FCW to the plurality of capacitor banks of the oscillator.

20 Claims, 18 Drawing Sheets

Related U.S. Application Data

(60) Provisional application No. 62/984,762, filed on Mar. 3, 2020.

(58) Field of Classification Search
USPC .................................................... 331/8, 1 A
See application file for complete search history.

(56) References Cited

U.S. PATENT DOCUMENTS

| | | |
|---|---|---|
| 5,325,095 A | 6/1994 | Vadnais et al. |
| 5,493,581 A | 2/1996 | Young et al. |
| 5,635,864 A | 6/1997 | Jones |
| 6,161,420 A | 12/2000 | Dilger et al. |
| 6,369,659 B1 | 4/2002 | Delzer et al. |
| 6,373,337 B1 | 4/2002 | Ganser |
| 6,556,636 B1 | 4/2003 | Takagi |
| 6,587,187 B2 | 7/2003 | Watanabe et al. |
| 6,975,165 B2 | 12/2005 | Lopez et al. |
| 7,042,958 B2 | 5/2006 | Biedka et al. |
| 7,095,274 B2 | 8/2006 | Lopez et al. |
| 7,193,462 B2 | 3/2007 | Braithwaite |
| 7,313,198 B2 | 12/2007 | Rahman et al. |
| 7,332,973 B2 | 2/2008 | Lee et al. |
| 7,400,203 B2 | 7/2008 | Ojo et al. |
| 7,447,272 B2 | 11/2008 | Haglan |
| 7,453,934 B2 | 11/2008 | Seppinen et al. |
| 7,564,929 B2 | 7/2009 | Lopez et al. |
| 7,602,244 B1 | 10/2009 | Holmes et al. |
| 7,773,713 B2 | 8/2010 | Cafaro et al. |
| 7,888,973 B1 | 2/2011 | Rezzi et al. |
| 8,314,653 B1 | 11/2012 | Granger-Jones et al. |
| 8,368,477 B2 | 2/2013 | Moon et al. |
| 8,421,661 B1 | 4/2013 | Jee et al. |
| 8,498,601 B2 | 7/2013 | Horng et al. |
| 8,666,325 B2 | 3/2014 | Shute et al. |
| 8,774,748 B2 | 7/2014 | Casagrande et al. |
| 8,787,511 B2 | 7/2014 | Brunn et al. |
| 8,804,875 B1 | 8/2014 | Xu et al. |
| 8,854,091 B2 | 10/2014 | Hossain et al. |
| 8,929,486 B2 | 1/2015 | Xu et al. |
| 8,941,441 B2 | 1/2015 | Testi et al. |
| 9,024,696 B2 | 5/2015 | Li et al. |
| 9,083,588 B1 | 7/2015 | Xu et al. |
| 9,178,691 B2 | 11/2015 | Shimizu et al. |
| 9,240,914 B2 | 1/2016 | Yao |
| 9,391,625 B1 | 7/2016 | Xu et al. |
| 9,479,177 B1 | 10/2016 | Buell et al. |
| 9,497,055 B2 | 11/2016 | Xu et al. |
| 9,519,035 B2 | 12/2016 | Ramirez |
| 9,673,828 B1 | 6/2017 | Xu et al. |
| 9,673,829 B1 | 6/2017 | Xu et al. |
| 9,813,011 B2 | 11/2017 | Despesse |
| 9,813,033 B2 | 11/2017 | Testi et al. |
| 9,819,524 B2 | 11/2017 | Khoury et al. |
| 9,985,638 B2 | 5/2018 | Xu et al. |
| 10,122,397 B2 | 11/2018 | Xu et al. |
| 10,148,230 B2 | 12/2018 | Xu et al. |
| 10,158,509 B2 | 12/2018 | Xu et al. |
| 10,320,403 B2 | 6/2019 | Xu et al. |
| 2001/0001616 A1 | 5/2001 | Rakib et al. |
| 2002/0048326 A1 | 4/2002 | Sahlman |
| 2002/0132597 A1 | 9/2002 | Peterzell et al. |
| 2003/0053554 A1 | 3/2003 | McCrokle et al. |
| 2003/0058036 A1 | 3/2003 | Stillman et al. |
| 2003/0142002 A1 | 7/2003 | Winner et al. |
| 2003/0174783 A1 | 9/2003 | Rahman et al. |
| 2004/0036538 A1 | 2/2004 | Devries et al. |
| 2004/0100330 A1 | 5/2004 | Chandler |
| 2004/0146118 A1 | 7/2004 | Talwalkar et al. |
| 2005/0285541 A1 | 12/2005 | Lechevalier |
| 2006/0078079 A1 | 4/2006 | Lu |
| 2006/0145762 A1 | 7/2006 | Leete |
| 2006/0193401 A1 | 8/2006 | Lopez et al. |
| 2006/0222109 A1 | 10/2006 | Watanabe et al. |
| 2006/0285541 A1 | 12/2006 | Roy |
| 2007/0132511 A1 | 6/2007 | Ryynänen et al. |
| 2008/0069514 A1 | 3/2008 | Son et al. |
| 2008/0079497 A1 | 4/2008 | Fang et al. |
| 2008/0112526 A1 | 5/2008 | Yi |
| 2008/0150645 A1 | 6/2008 | McCorquodale et al. |
| 2008/0170552 A1 | 7/2008 | Zaks |
| 2008/0192872 A1 | 8/2008 | Lindoff |
| 2008/0192877 A1 | 8/2008 | Eliezer et al. |
| 2008/0205709 A1 | 8/2008 | Masuda et al. |
| 2008/0211576 A1 | 9/2008 | Moffatt et al. |
| 2008/0220735 A1 | 9/2008 | Kim et al. |
| 2008/0225981 A1 | 9/2008 | Reddy et al. |
| 2008/0225984 A1 | 9/2008 | Ahmed et al. |
| 2008/0291064 A1 | 11/2008 | Johansson et al. |
| 2009/0153244 A1 | 6/2009 | Cabanillas et al. |
| 2009/0256601 A1 | 10/2009 | Zhang et al. |
| 2009/0295493 A1 | 12/2009 | Lee et al. |
| 2009/0302908 A1 | 12/2009 | Nakamura |
| 2010/0303047 A1 | 12/2010 | Ibrahim et al. |
| 2011/0003571 A1 | 1/2011 | Park et al. |
| 2011/0019657 A1 | 1/2011 | Zaher |
| 2011/0050296 A1 | 3/2011 | Fagg |
| 2011/0159877 A1 | 6/2011 | Kenington et al. |
| 2011/0260790 A1 | 10/2011 | Haddad |
| 2011/0298557 A1 | 12/2011 | Kobayashi |
| 2011/0299632 A1 | 12/2011 | Mirzaei et al. |
| 2011/0300885 A1 | 12/2011 | Darabi et al. |
| 2012/0032718 A1 | 2/2012 | Chan et al. |
| 2012/0074990 A1 | 3/2012 | Sornin |
| 2012/0256693 A1 | 10/2012 | Raghunathan et al. |
| 2012/0306547 A1 | 12/2012 | Arora et al. |
| 2013/0143509 A1 | 6/2013 | Horng et al. |
| 2013/0147529 A1* | 6/2013 | Ganesan ............... H03L 7/1803 327/156 |
| 2013/0154698 A1* | 6/2013 | Bottelli .................... H03L 7/08 327/157 |
| 2013/0257494 A1 | 10/2013 | Nikaeen et al. |
| 2014/0023163 A1 | 1/2014 | Xu |
| 2014/0133528 A1 | 5/2014 | Noest et al. |
| 2014/0185723 A1 | 7/2014 | Belitzer |
| 2014/0266454 A1 | 9/2014 | Testi et al. |
| 2014/0266480 A1 | 9/2014 | Li et al. |
| 2014/0269999 A1 | 9/2014 | Cui et al. |
| 2014/0270003 A1 | 9/2014 | Xu et al. |
| 2014/0321479 A1 | 10/2014 | Zhang et al. |
| 2015/0180685 A1 | 6/2015 | Noest et al. |
| 2015/0207499 A1 | 7/2015 | Horng et al. |
| 2015/0229318 A1 | 8/2015 | Tamura et al. |
| 2016/0074224 A1 | 3/2016 | Scheller et al. |
| 2016/0139568 A1 | 5/2016 | Schimper |
| 2016/0155558 A1 | 6/2016 | Groves et al. |
| 2016/0169717 A1 | 6/2016 | Zhitomirsky |
| 2017/0085405 A1 | 3/2017 | Xu et al. |
| 2017/0163272 A1 | 6/2017 | Xu et al. |
| 2017/0187364 A1 | 6/2017 | Park et al. |
| 2017/0194973 A1 | 7/2017 | Moehlmann |
| 2017/0264306 A1 | 9/2017 | Li |
| 2018/0196972 A1 | 7/2018 | Lu et al. |
| 2018/0205384 A1 | 7/2018 | Lee |
| 2018/0287646 A1 | 10/2018 | Xu et al. |
| 2019/0059055 A1 | 2/2019 | Murali |
| 2020/0083857 A1 | 3/2020 | Testi et al. |

FOREIGN PATENT DOCUMENTS

| | | |
|---|---|---|
| EP | 1187313 B1 | 2/2008 |
| JP | H07221570 A | 8/1995 |
| JP | H1188064 A | 3/1999 |
| JP | 2012134981 A | 7/2012 |

(56) References Cited

FOREIGN PATENT DOCUMENTS

| KR | 20150007728 A | 1/2015 |
|---|---|---|
| WO | 2005078921 A2 | 8/2005 |
| WO | 2005078921 A3 | 4/2006 |
| WO | 2012132847 A1 | 10/2012 |

OTHER PUBLICATIONS

Wiser, Robert F., et al., "A 5-GHz Wireless LAN Transmitter with Integrated Tunable High-Q RF Filter", IEEE Journal of Solid-State Circuits, vol. 44, No. 8, Aug. 2009, 2114-2125 (12 pages).
Yu, Jianjun , et al., "A 3-Dimensional Vernier Ring Time-to-digital Converter in 0.13μm CMOS", Electrical and Computer Engineering, Auburn University, Auburn AL, Sep. 19, 2010, 1-4 (4 pages).
International Search Report and Written Opinion for PCT/US2014/029055, dated Sep. 15, 2014, 1-12 (12 pages).
International Search Report and Written Opinion for PCT/US2016/053484, dated Dec. 19, 2016, 1-8 (8 pages).
International Search Report and Written Opinion for PCT/US2016/064772, dated Feb. 28, 2017, 1-7 (7 pages).
International Preliminary Report on Patentability for PCT/US2018/027222 completed Apr. 4, 2019, dated Jun. 20, 2019, 1-3 (3 pages).
International Search Report and Written Opinion for PCT/US2014/030525, dated Jul. 24, 2014, 1-16 (16 pages).
International Search Report and Written Opinion for PCT/US2014/026459, dated Jul. 28, 2014, 1-10 (10 pages).
International Search report and Written Opinion for PCT/US20/12607, dated May 7, 2020, 1-17 (17 pages).
International Search Report and Written Opinion of the International Searching Authority for PCT/US13/024159, dated Apr. 9, 2013, 1-8 (8 pages).
International Search Report and Written Opinion for PCT/US2019/067237, dated Apr. 24, 2020, 1-14 (14 pages).
International Search Report and Written Opinion for PCT/US2019/049493, dated Apr. 29, 2020, 1-10 (10 pages).
International Search Report and Written Opinion for PCT/US2019/057432, dated Apr. 6, 2020, 1-9 (9 pages).
International Preliminary Report on Patentability for PCT/US2016/064772, dated Jun. 14, 2018, 1-6 (6 pages).
International Search report and Written Opinion for PCT/US18/27222, dated Jun. 28, 2018, 1-6 (6 pages).
Aeroflex , "Measurement of Frequency Stability and Phase Noise", Application Note, Part No. 46891/865, Issue 1, Feb. 2007, 1-8 (8 pages).
Betancourt-Zamora, Rafael , et al., "1-GHz and 2.8-GHz CMOS Injection-Locked Ring Oscillator Prescalers", Allen Center for Integrated Systems, Stanford University, Conference Paper, Feb. 2001, 1-5 (5 pages).
Buckel, Tobias , et al., "A Highly Reconfigurable RF-DPLL Phase Modulator for Polar Transmitters in Cellular RFICs", IEEE Transactions on Microwave Theory and Techniques, vol. 66, No. 6, Jun. 2018, 2618-2627 (10 pages.
Chen, Chi-Tsan , et al., "Cognitive Polar Receiver Using Two Injection-Locked Oscillator Stages", IEEE Transactions on Microwave Theory and Techniques, vol. 59, No. 12, Dec. 2011, 3484-3493 (10 pages).
Chen, Chi-Tsan , et al., "Wireless Polar Receiver Using Two Injection-Locked Oscillator Stages for Green Radios", IEEE MTT-S International, Jun. 2011, 1-4 (4 pages).
Cheng, Jiao , et al., "A 1.3mW 0.6V WBAN-Compatible Sub-Sampling PSK Receiver in 65nm CMOS", IEEE nternational Solid-State Circuits Conference, ISSCC Session 9.6, Feb. 11, 2014, 168-170 (3 pages).
Chien, Jun-Chau , et al., "Analysis and Design of Wideband Injection-Locked Ring Oscillators With Multiple-Input Injection", IEEE Journal of Solid-State Circuits, vol. 42, No. 9, Sep. 2007, 1906-1915 (10 pages).
Darvishi, Milad , et al., "A 0.3-to-1.2GHz Tunable 4th-Order Switched gm-C Bandpass Filter with >55dB Ultimate Rejection and Out-of-Band IIP3 of +29dBm", 2012 IEEE International Solid-State Circuits Conference, Session 21.1, 2012, 358-360 (3 pages).
Dudek, Piotr , et al., "A High-Resolution CMOS Time-to-Digital Converter Utilizing a Vernier Delay Line, IEEE Transactions on Solid-State Circuits", vol. 35, No., 2, Feb. 2000, 240-247 (8 pages).
Effendrik, Popong , "Time-to-Digital Converter (TDC) for WiMAX ADPLL in State-of-The-Art 40-nm CMOS", MSc Theses, Delft University of Technology, Apr. 18, 2011, 1-80 (80 pages).
Frantz, Claude , "Frequency Discriminator", DJ0OT, 1994, 1-7 (7 pages).
He, Xin , et al., "A 2.5-GHz Low-Power, High Dynamic Range, Self-Tuned Q-Enhanced LC Filter in SOI", IEEE Journal of Solid-State Circuits, vol. 40, No. 8, Aug. 2005, 1618-1628 (11 pages).
He, Xin et al., "A Fully Integrated Q-enhanced LC Filter with 6 dB Noise Figure at 2.5 GHz in SOI", IEEE Radio Frequency Integrated Circuits Symposium, 2004, 643-646 (4 pages).
Henzler, S. , "Time to Digital Converters", Springer Series in Advanced Microelectronics 29, Chapter 2, Springer Science+Business Media B.V., 2010, 5-19 (15 pages).
Hewlett Packard , "Phase Noise Characterization of Microwave Oscillators", Frequency Discriminator Method, Product Note 11729C-2, Sep. 1985, 1-45 (45 pages).
Jovanovic, G.S. , et al., "Vernier's Delay Line Time-to-Digital Converter", Scientific Publications of the State University of Novi Pazar, Ser. A: Appl. Math. Inform. And Mech., vol. 1, 1, 2009, 11-20 (10 pages).
Li, Xiaoyong , et al., "20-Mb/s GFSK Modulator Based on 3.6-GHz Hybrid PLL with 3-b DCO Nonlinearity Calibration and Independent Delay Mismatch Control", IEEE Transactions on Microwave Theory and Techniques, vol. 65, No. 7, Jul. 2017, 2387-2398 (12 pages).
Li, Dandan , et al., "Design Techniques for Automatically Tuned Integrated Gigahertz-Range Active LC Filters", IEEE Journal of Solid- State Circuits, vol. 37, No. 8, Aug. 2002, 967-977 (11 pages).
Liao, Dongyi et al. "An 802.11a/b/g/n Digital Fractional-N PLL With Automatic TDC Linearity Calibration for Spur Cancellation", IEEE Journal of Solid-State Circuits, 0018-9200, Jan. 16, 2017, 1-11 (11 pages).
Lin, Chin-Hsin , et al., "Single-Stage Vernier Time-to-Digital Converter with Sub-Gate Delay Time Resolution", Scientific Research, Circuits and Systems, vol. 2, Oct. 2011, 365-371 (7 pages).
Liscidini, Antonio , et al., "Time to Digital Converter based on a 2-dimensions Vernier architecture", University of Pavia, IEEE Custom Integrated Circuits Conference, Sep. 13, 2009, 1-4 (4 pages).
Ló-Villegas, José María et al., "BPSK to ASK Signal Conversion Using Injection-Locked Oscillators—Part I: Theory", IEEE Transactions on Microwave Theory and Techniques, vol. 53, No. 12, Dec. 2005, 3757-3766 (10 pages).
Markulic, Nereo , et al., "A self-calibrated 10Mb/s phase modulator with -37.4dB EVM based on a 10.1-to-12.4GHz, -246.6dB-FOM, fractional-n subsampling PLL", IEEE International Solid-State Circuits Conference (ISSCC), San Francisco, Session 97, 2016, 176-178 (3 pages).
Marzin, Giovanni , et al., "A 20Mb/s Phase Modulator Based on a 3.6GHz Digital PLL with -36dB EVM at 5 mW Power", IEEE International Solid-State Circuits Conference, vol. 47, No. 12, Dec. 2012, 2974-2988 (15 pages).
Mirzaei, Ahmad , et al., "Multi-Phase Injection Widens Lock Range of Ring-Oscillator-Based Frequency Dividers", EEE Journal of Solid-State Circuits, vol. 43, No. 3, Mar. 2008, 656-671 (16 pages.
Nazari, Peyman , "Polar Quantizer for Wireless Receivers: Theory, Analysis, and CMOS Implementation", IEEE Transactions on Cricuits and Systems, vol. 61, No. 3, Mar. 2014, 1-94 (94 pages).
O'Brien, Paul , "A Comparison of Two Delay Line Discriminator Implementations for Low Cost Phase Noise Measurement", Analog Devices Raheen Business Park Limerick Ireland, 2010, 1-11 (11 pages).
Pellerano, Stefano , et al., "A 4.75-GHz Fractional Frequency Divider-by-1.25 With TDC-Based All-Digital Spur calibration in 45-nm CMOS", IEEE Journal of Solid-State Circuits, vol. 44, No. 12, Dec. 2009, 3422-3433 (12 pages).

(56) References Cited

OTHER PUBLICATIONS

Putnam, William, et al., "Design of Fractional Delay Filters Using Convex Optimization", IEEE ASSP Workshop on Applications of Signal Processing to Audio and Acoustics (CCRMA), Stanford University, 1997, 1-5 (5 pages).

Rategh, Hamid R., et al., "Superharmonic Injection Locked Oscillators as Low Power Frequency Dividers", Stanford Jniversity, Symposium on VLSI Circuits, Digest of Technical Papers, Jun. 1998, 1-4 (4 pages).

Razavi, Behzad, "A Study of Injection Pulling and Locking in Oscillators", Electrical Engineering Department, Jniversity of California, IEEE Custom Integrated Circuits Conference, 2003, 305-312 (8 pages).

Ross, Andrew, "Power Save Issues in WLAN", Silex Technology America, Inc., 2014, 1-35 (35 pages).

Siripon, N., et al., "Novel Sub-Harmonic Injection-Locked Balanced Oscillator", Microwave and Systems Research Group (MSRG), School of Electronics, Computing and Mathematics, University of Surrey, 31st European Microwave conference, Sep. 24, 2011, 1-4 (4 pages.

Testi, Nicolo, et al., "A 2.4GHz 72dB-Variable-Gain 100dB-DR 7.8mW 4th-Order tunable Q-Enhanced LC Band-Pass Filter.", IEEE Radio Frequency Integrated Circuits Symposium (RFIC), 2015, 87-90 (4 pages).

Tiebout, Marc, "A 50GHz Direct Injection Locked Oscillator Topology as Low Power Frequency Divider in 0.13 μm CMOS", Infineon Technologies AG, Solid-State Circuits Conference, 29th European ESSCIRC, 2003, 1-4 (4 pages).

Tsai, Pei-Kang, et al., "Wideband Injection-Locked Divide-by-3 Frequency Divider Design with Regenerative Second- Harmonic Feedback Technique", Wideband Injection-Locked Divide-by-3 Frequency Divider Design with Regenerative Second-Harmonic Feedback Technique, Mar. 21, 2013, 1-4 (4 pages).

US Navy, "Electronic Warfare and Radar Systems Engineering Handbook", Naval Air Systems command and Naval Air Warfare Center, USA, Mixers and Frequency Discriminators, Section 6-8.1 to 6-8.2, Apr. 1, 1999, 1-299 (299 pages).

International Search Report and Written Opinion for PCT/US2021/018778, dated Jun. 9, 2021, 1-8 (8 pages).

\* cited by examiner

PHASE MODULATOR HAVING FRACTIONAL SAMPLE INTERVAL TIMING SKEW FOR FREQUENCY CONTROL INPUT

CROSS-REFERENCE TO RELATED APPLICATIONS

This application is a continuation-in-part of U.S. application Ser. No. 16/125,510, filed Sep. 7, 2018, entitled "Frequency Control Word Linearization for an Oscillator" and also claims the benefit of U.S. Provisional Application No. 62/984,762, filed Mar. 3, 2020, entitled "Phase Modulator Having Fractional Sample Interval Timing Skew for Frequency Control Input", each of which is hereby incorporated herein by reference in its respective entirety for all purposes.

BACKGROUND

In general, in a polar-type digital transmitter, phase signals $\varphi(t)$ in the range of $[-\pi, \pi)$ (or equivalently $(0, 2\pi]$) are phase-modulated onto a radio frequency (RF) carrier. To accomplish this, the polar transmitter circuit may include a digitally-controlled oscillator (DCO) which may be, for example, directly phase modulated. In this regard, the phase signals may be processed accordingly to obtain corresponding (instantaneous) digital frequency values in the form of digital control signals that may be used to digitally control capacitance values in a tank circuit of the DCO. When each control signal is provided as an input into the DCO, the DCO resonance characteristics are altered to cause the DCO to generate a corresponding phase modulated signal in accordance with the phase values.

In some implementations, a tank circuit (or, a resonant circuit) of the DCO may include multiple capacitors in the form of multiple capacitor banks, where capacitors in each respective capacitor bank may be selectively turned on and off to obtain a desired frequency out of the DCO. Such solutions have been adequate for use in relatively low speed communication systems.

Due to the high modulate rates of modern communication systems, there is a need for modulators that have a very wide bandwidth and very low output distortion. Accordingly, a need exists for oscillators with improved characteristics.

BRIEF DESCRIPTION OF THE SEVERAL VIEWS OF THE DRAWINGS

The accompanying figures, where like reference numerals refer to identical or functionally similar elements throughout the separate views, together with the detailed description below, serve to further illustrate embodiments of concepts that include the claimed invention, and explain various principles and advantages of those embodiments.

Figure 1:
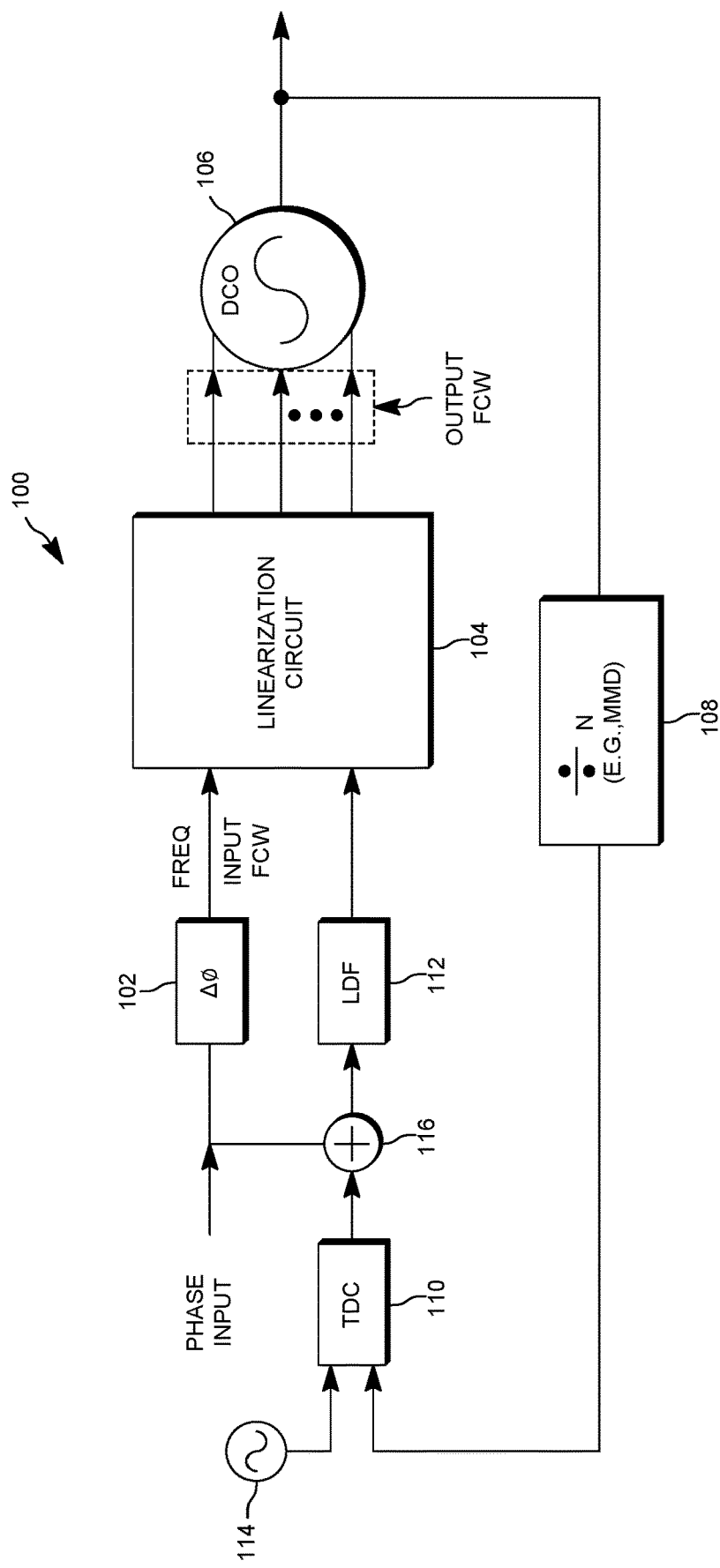
FIG. 1 is a block diagram of an example phase-locked loop modulator circuit configuration including a linearization circuit, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Described herein is a method and circuit that facilitates linearizing a frequency response of an oscillator, such as a DCO. In accordance with illustrative embodiments, the present disclosure provides a linearization method and circuit for adjusting an input frequency control word (FCW) to be provided to an oscillator with a plurality of capacitor banks to compensate for non-linear behavior of the oscillator.

More specifically, in some embodiments, the linearization circuit is operative to generate a set of reference output FCWs for an associated set of frequencies. When the linearization circuit receives an input FCW generated from a modulator (referred to herein as an "ideal" FCW), it may responsively generate an output FCW based on (i) an interpolation between two reference output FCWs of the set of reference output FCWs and (ii) respective sensitivity characteristics of at least two capacitor banks of the oscillator. Further, the linearization circuit may generate an output FCW to be applied to the at least two capacitor banks of the oscillator that are digitally controlled in accordance with the output FCW. In response, the oscillator may generate an output signal with a frequency corresponding to the output FCW.

FIG. 1 is a block diagram of an example phase-locked loop circuit configuration including a linearization circuit, in accordance with some embodiments. Referring to FIG. 1, a phase-locked loop configuration 100 includes a differentiator 102, a linearization circuit 104, a digitally controlled oscillator (DCO) 106, a frequency divider 108, a time-to-digital converter (TDC) 110, a loop filter 112, and a summation element 116.

In operation, a differentiator 102 is configured to receive an input phase signal and take a time differential of the phase signal to generate a differentiated phase signal corresponding to an input frequency control word (FCW) (as denoted in FIG. 1). In illustrative embodiments, the phase signal values provided to the differentiator 102 may be an N-bit phase codewords covering a wrapped phase signal $\varphi(n)$ in the range of $(-\pi, \pi]$ (or equivalently $[0, 2\pi)$). In this regard, the phase codewords may be divided equally among that range, resulting in $2^N$ digital phase values. The phase values may be provided from a CORDIC circuit used to convert in-phase and quadrature signals (I/Q) generated from a signal mapper with a modulator.

In some embodiments, the differentiator 102 may operate by generating a difference between two sequential phase codewords. To illustrate, the differentiator 102 may operate by subtracting a previous value of the phase signal from a current value of the phase signal. As an example, in some embodiments, the differentiator may be implemented by a two-tap filter representing a simple difference equation, such as $f[n]=x[n]-x[n-1]$. In other embodiments, the differentiator 102 may be configured in other ways.

In illustrative embodiments, the frequency values output by the differentiator 102 may be in the form of N-bit digital codewords, or more specifically input FCWs (e.g., 18-bit FCWs) that, ideally, correspond to the differentiated phase values for controlling the DCO 106 so as to generate an output signal with a desired frequency. As is known, altering a phase of a carrier signal may be performed by causing deviations in the frequency around the carrier. The input FCW is then provided to the linearization circuit 104 that is operative to adjust the input FCW and produce an output FCW (as denoted in FIG. 1) that is applied to the DCO 106. Although not shown in detail in FIG. 1, the DCO 106 includes a tank circuit having multiple capacitor banks that are digitally controlled in accordance with the output FCW provided out of the linearization circuit 104.

Figure 10:
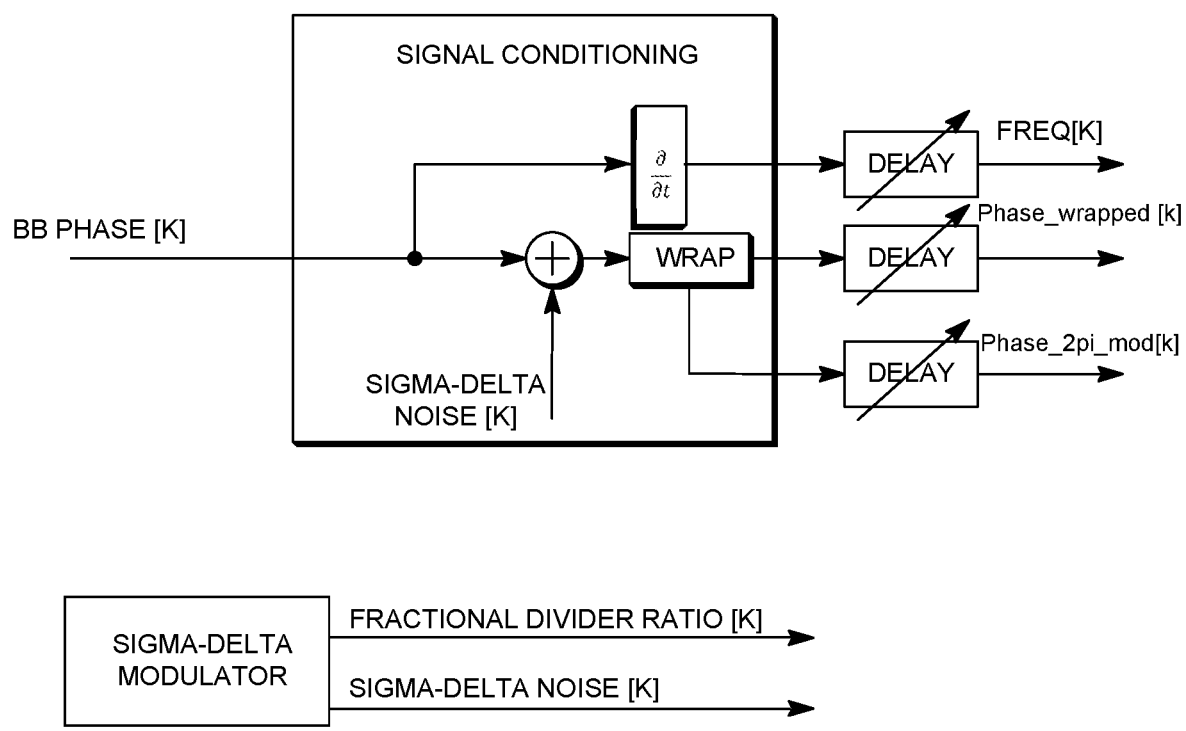
FIG. 10 is a block diagram of the phase signal processing for the modulator circuit.

As further illustrated in FIG. 1, an oscillating signal with a desired frequency may be generated by the DCO, where the frequency is determined by reactive components within the DCO, which are in turn controlled by the FCW. The FCW may include multiple inputs each carrying a fractional portion (or a set of bits) of the output FCW that respectively controls an associated capacitor bank in the multiple capacitor banks of the DCO 106. As further shown in FIG. 1, a number of inputs into the DCO 106 may vary based on a number of capacitor banks in the DCO's tank circuit. The oscillator output signal is fed back to a frequency divider 108, which divides the frequency of the oscillating signal by a frequency divisor N to generate a frequency-divided signal. In some embodiments, the frequency divider 108 is a multi-modulus frequency divider (MMD), with the frequency divisor N being controlled by frequency divider control logic, that is driven by the summation of the fractional divider ratio [k] plus the Phase_2pi_mod[k] signals as shown in FIG. 10. A multi-modulus frequency divider may be implemented using, for example, a cascaded chain of frequency divider sections. The divisor N may be an integer divisor or may be a fractional divisor. In some embodiments, the multiple modulus divider is dynamically adjusted to account for the occurrence of phase jumps in the phase-wrapped input signal, such that a $2\pi$ phase error will be injected and measured by the TDC to fully offset, or cancel, a $2\pi$ phase jump in the phase-wrapped input. Incorporated herein by reference is U.S. Pat. No. 9,391,625, entitled "Wideband Direct Modulation with Two-Point Injection in Digital Phase Locked Loops", issued Jul. 12, 2016.

Additionally, the phase-locked loop configuration 100 includes a reference oscillator 114, which may provide a reference signal (e.g., a clock signal) as an input to a time-to-digital converter (TDC) 110 operative to compare a phase of the frequency-divided signal out of the frequency divider 108 with a phase of the cyclic reference signal to generate a measured phase signal. The time-to-digital converter 110 may operate by, for example, measuring an elapsed time between a rising edge of the frequency-divided signal and a rising edge of the reference signal.

The phase-locked loop configuration 100 also includes a summation element 116, which may be an adder operating on the wrapped-phase input signal. In some embodiments, the summation element 116 operates to inject the wrapped-phase input signal into the feedback loop. In particular, the summation logic 116 is operative to sum the wrapped-phase input signal with the measured phase signal to generate an error signal. The error signal represents a difference between the phase of the oscillating signal from the DCO 106 and the wrapped-phase input signal. When the signal from the DCO 106 has a phase equal to the phase indicated by the wrapped-phase input signal, the error signal is substantially equal to zero. When the signal from the DCO 106 has a phase different from the phase indicated by the wrapped-phase input signal, the error signal contributes to a control signal that controls the DCO 106.

As shown in FIG. 1, the error signal is filtered by a loop filter 112, which may be a digital proportional-integral (PI) filter, to generate a filtered error signal. In turn, the filtered error signal is provided as an input to the linearization circuit 104. As noted above, in some embodiments, the filtered error signal contributes to a control signal that controls the DCO 106. Namely, as will be described later in further detail, in some embodiments, the filtered phase error signal will contribute to at least a portion of the output FCW generated by the linearization circuit in order to control a frequency of oscillation of the DCO 106.

Due to a non-ideal behavior of an oscillator, such as the DCO 106, a frequency response of the DCO may be non-linear. More specifically, the non-linearity in the DCO frequency response may arise due to non-ideal behavior of capacitors in capacitors banks in a tank circuit of the DCO 106.

Figure 2:
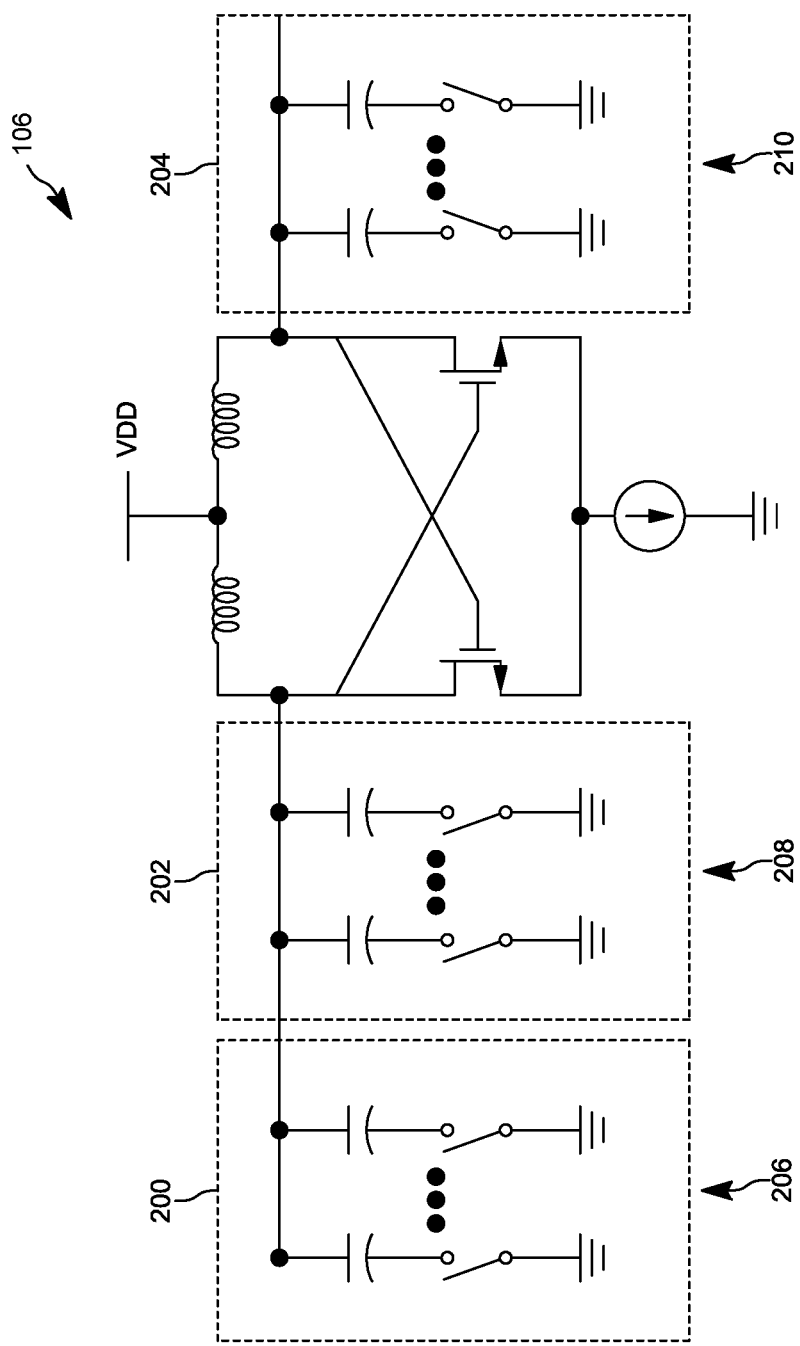
FIG. 2 illustrates one example structure of the DCO of FIG. 1, in accordance with some embodiments.

FIG. 2 illustrates one example structure of the DCO of FIG. 1, in accordance with some embodiments. More specifically, as shown, a tank circuit of the DCO 106 may include multiple switched capacitor banks 200-204 each comprising a respective plurality of capacitors and providing a variable capacitance. In this regard, a respective set of bits of an FCW applied to the capacitor banks may be used to selectively control the plurality of capacitors of the capacitor bank, such via control inputs 206-210.

Figure 3:
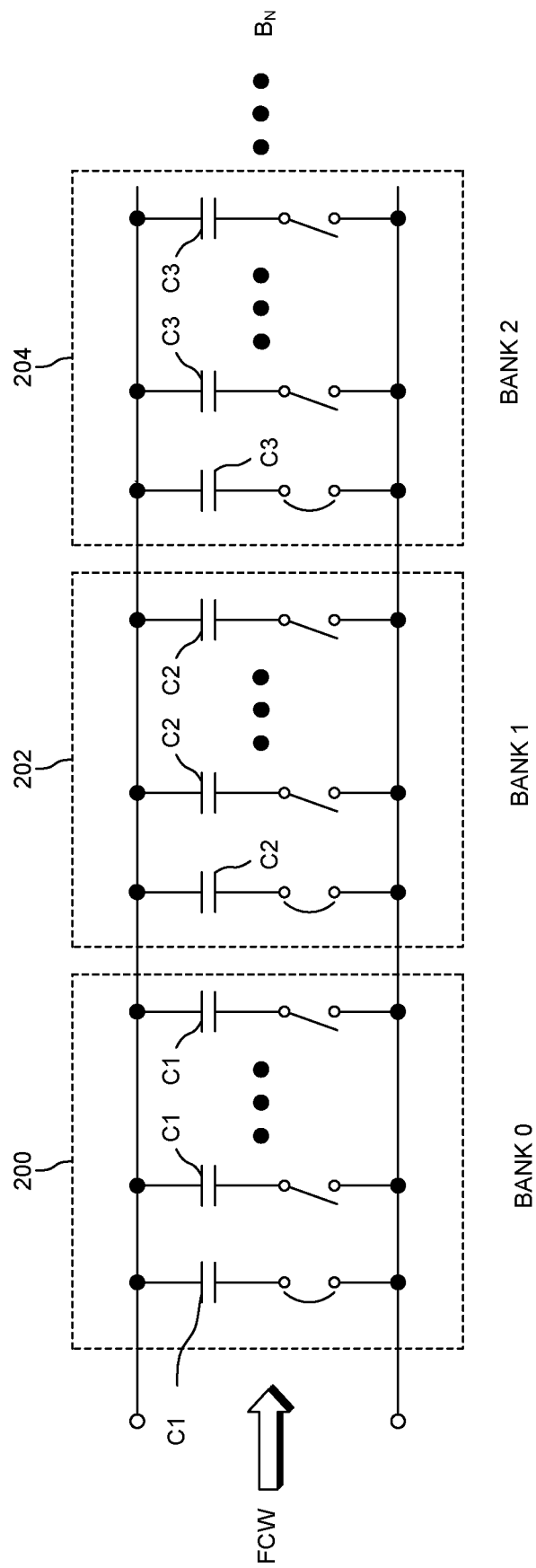
FIG. 3 illustrates a series of capacitors banks, including the capacitor banks of FIG. 2, in greater detail.

Namely, in the embodiment of FIG. 2, each set of bits associated with a given capacitor bank may be applied to the gates of transistors within that bank to selectively place the switches in an on or off state to alter the bank's overall capacitance by activating selected capacitor(s). Note that although FIG. 2 shows three capacitor banks, in other embodiments, the DCO 106 may include only two capacitor banks or more than three capacitor banks. In some embodiments, an additional bank of capacitors may be provided to adjust the overall initial oscillatory range according to process, voltage, and temperature (PVT) variations. FIG. 3 illustrates a series of capacitors banks, including the capacitor banks of FIG. 2, in greater detail.

For instance, in some embodiments, the FCW applied to the capacitor banks 200-204 may an 18-bit control word. A set of most significant bits, which in one example is 5 bits, of the output FCW may be used to selectively change a capacitance of the first capacitor bank 200 (denoted as "Bank 0") that may contain largest-sized capacitors to provide coarse capacitance resolution. As a result, $2^5$, or 32, capacitance values are possible. The next 6-bit set (or portion) of bits of the output FCW may be used to selectively change a capacitance of the second capacitor bank that may contain, e.g., medium-sized capacitors to provide intermediate capacitance resolution. As a result, $2^6$, or 128, capacitance values are possible. Lastly, a 7-bit set of least significant bits of the output FCW may be used to selectively change a capacitance of the third capacitor bank 206 that may contain smallest-sized capacitors to provide fine capacitance resolution. As a result, $2^7$, or 256, capacitance values are possible.

In illustrative embodiments, each capacitor bank comprises a set of capacitors that are each of a given capacitance size that varies from one capacitor bank to another capacitor bank, as shown, for example, in FIG. 3. The resonance of the DCO generally decreases with increasing capacitance according to $1/\sqrt{C}$. Different banks of capacitors may be used to tune a resonant frequency of the DCO 106. Normally, capacitors in a capacitor bank having larger-sized capacitors, such as Bank 0, will provide a largest frequency step (or, a frequency change) as each capacitor in the bank is incrementally added or removed (removal of a capacitor results in an increase in frequency). In contrast, capacitors in a capacitor bank having smallest-sized capacitors, such as Bank 3, will provide smallest frequency step (or, a frequency change) as each capacitor in the bank is successively turned on/activated, or removed. Hence, to get intermediate frequencies between largest frequency steps, medium and small-valued capacitors in the other two banks are set accordingly.

In operation, to cover an entire frequency operating range of the oscillator (e.g., a frequency range corresponding to a range of phase values from 0 to $2\pi$), capacitors in Bank 2 (i.e., capacitors with the finest capacitance resolution) may be first activated/removed. Once all the capacitors in that bank are activated, one-by-one capacitors with a bigger frequency step may be successively activated, i.e., the capacitors in Bank 1, whereupon for each increment of the capacitors in Bank 1, the capacitors in Bank 2 are reset to zero and then successively activated. Once all of the caps in Bank 1 are exhausted, capacitors with the largest frequency step may be successively activated, each time restarting the cycle of incremental increases of Bank 1 and Bank 2. Note also that the DCO may be configured to provide a desired bandwidth according to the desired phase change, according to:

$$\text{desired\_phase\_change} = 2\pi * DCO\_\text{freq\_excursion} * \text{time\_at\_that\_frequency},$$

which, in one embodiment where a desired phase change in 1 clock cycle, would yield:

$$\text{desired\_phase\_change} = 2\pi * DCO\_\text{freq\_excursion} * 1/160 \text{ MHz} = 2\pi * DCO\_\text{freq\_change} * 6.25 \text{ ns}.$$

Thus, for a change of $\pi$, we have $2\pi * 80 \text{ MHz} * 6.25 \text{ ns} = \pi$.

Those skilled in the art will appreciate that each binary code word may be converted to a corresponding thermometer code to facilitate selection of each additional capacitor in a given bank one by one. In general, in thermometer coding, the number of "1" bits add up to a number counted. Hence, for each code word change, a corresponding thermometer code would change by an additional "1" bit.

However, due to non-ideal behavior of capacitors in a given capacitor bank of an oscillator, each capacitor bank will typically have a respective slope, or sensitivity characteristic that indicates how that capacitor bank responds to an incremental addition of capacitors in that bank. Namely, the respective sensitivity characteristic of the capacitor bank indicates a change in a frequency of the oscillator that occurs as a result of an incremental addition of each capacitor in the capacitor bank, or a change in frequency in response to an incremental bit change in a control word controlling that particular capacitor bank.

In other words, the respective sensitivity characteristic of the capacitor bank indicates a change in the frequency of the oscillator in response to an incremental bit change in a set of bits of an FCW applied to the bank of the oscillator. The respective sensitivity characteristic of the capacitor bank is a value corresponding to a frequency value indicating a change in frequency (or delta ($\Delta$) frequency) per capacitor removed.

Figure 4:
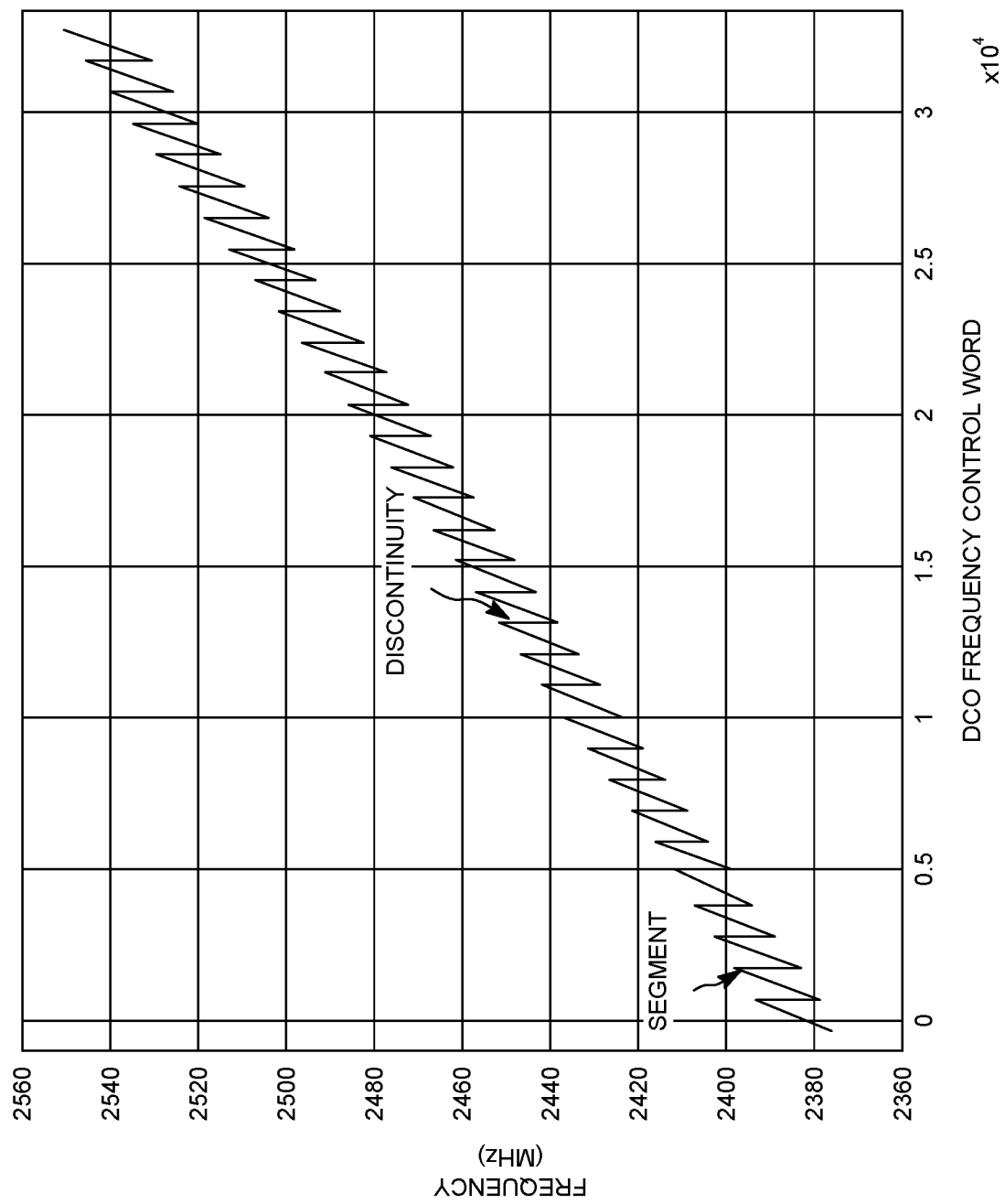
FIG. 4 illustrates an example of a plot of a frequency response of a DCO in response to a frequency control word that is not linearized.

Given that each capacitor bank may have its own sensitivity characteristic, an output frequency response of a DCO, such as the DCO 106, will typically be non-linear as capacitors in respective capacitor banks are selectively removed (increasing frequency) or added (decreasing frequency). FIG. 4 illustrates an example of a plot of a frequency response of a DCO in response to a frequency control word that is not linearized.

In this example, the FCW may be an 18-bit FCW, where, e.g., 5 most significant bits of the FCW may be used to change a capacitance of a capacitor bank with largest-sized capacitors, such as Bank 0 in FIG. 3. Although not shown in detail, each line segment (as denoted in FIG. 4) includes finer frequency steps obtained using additional capacitor banks, such as Banks 1 and 2 of FIG. 3 controlled by a remainder of the 18-bit FCW (i.e., 13 bits). On the other hand, each falling edge (or discontinuity, as denoted in FIG. 4) indicates a change in frequency response with an incremental addition (or removal) of each capacitor the capacitor bank with the largest-sized capacitors, such as Bank 0, coupled with resetting/setting of the capacitors in the next finer bank.

Figure 5:
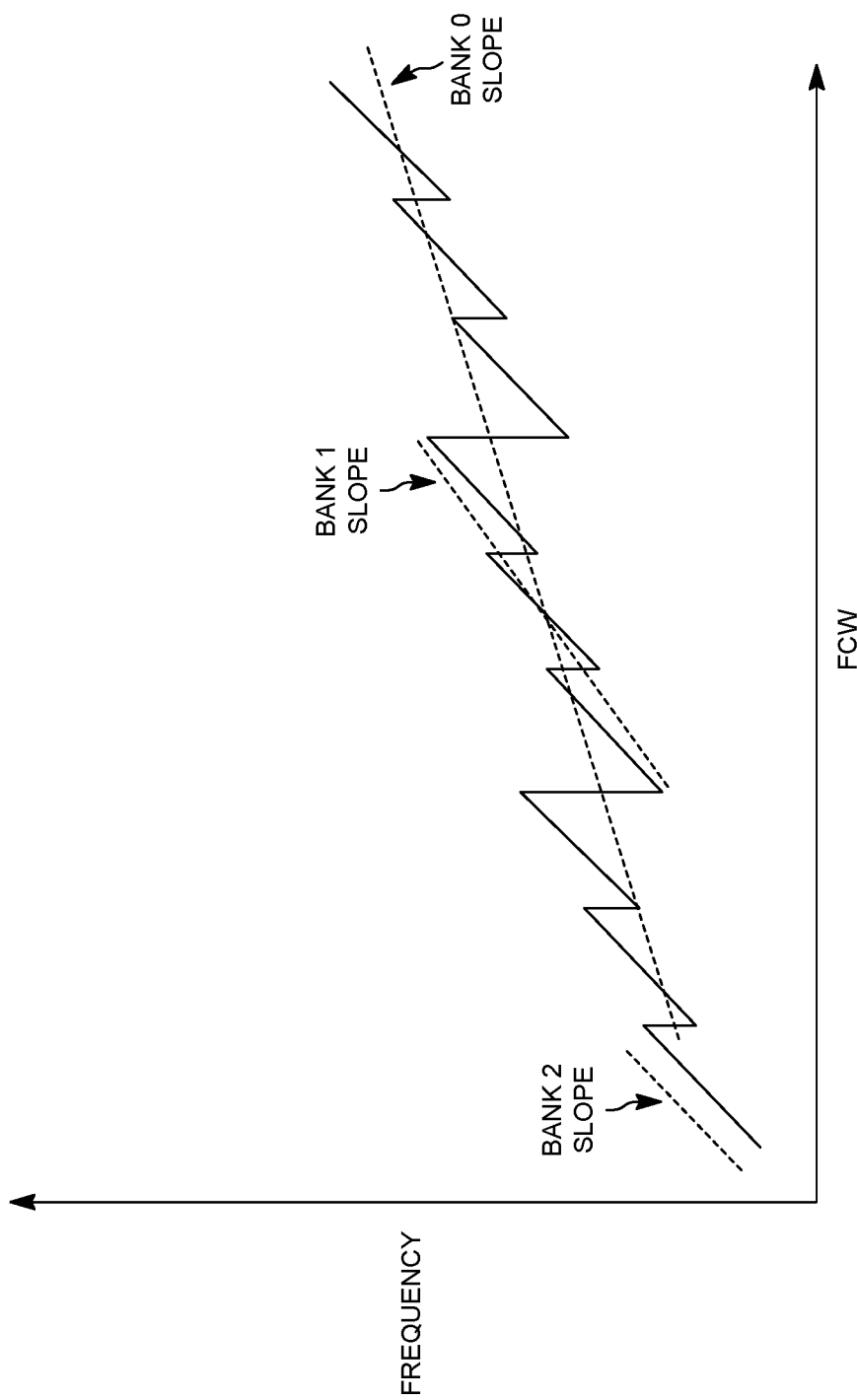
FIG. 5 illustrates an example of a portion of the plot of FIG. 4 in greater detail, in accordance with some embodiments.

FIG. 5 then illustrates an example of a portion of the plot of FIG. 4 in greater detail. More particularly, FIG. 5 shows an example of non-linearities that may arise in the DCO output frequency as a result of different sensitivity characteristics (slopes of frequency responses) of respective capacitor banks, such as Banks 0-2 in FIG. 3. Further, FIG. 5 shows the respective sensitivity characteristics (slopes) associated with each respective capacitor bank.

Figure 6:
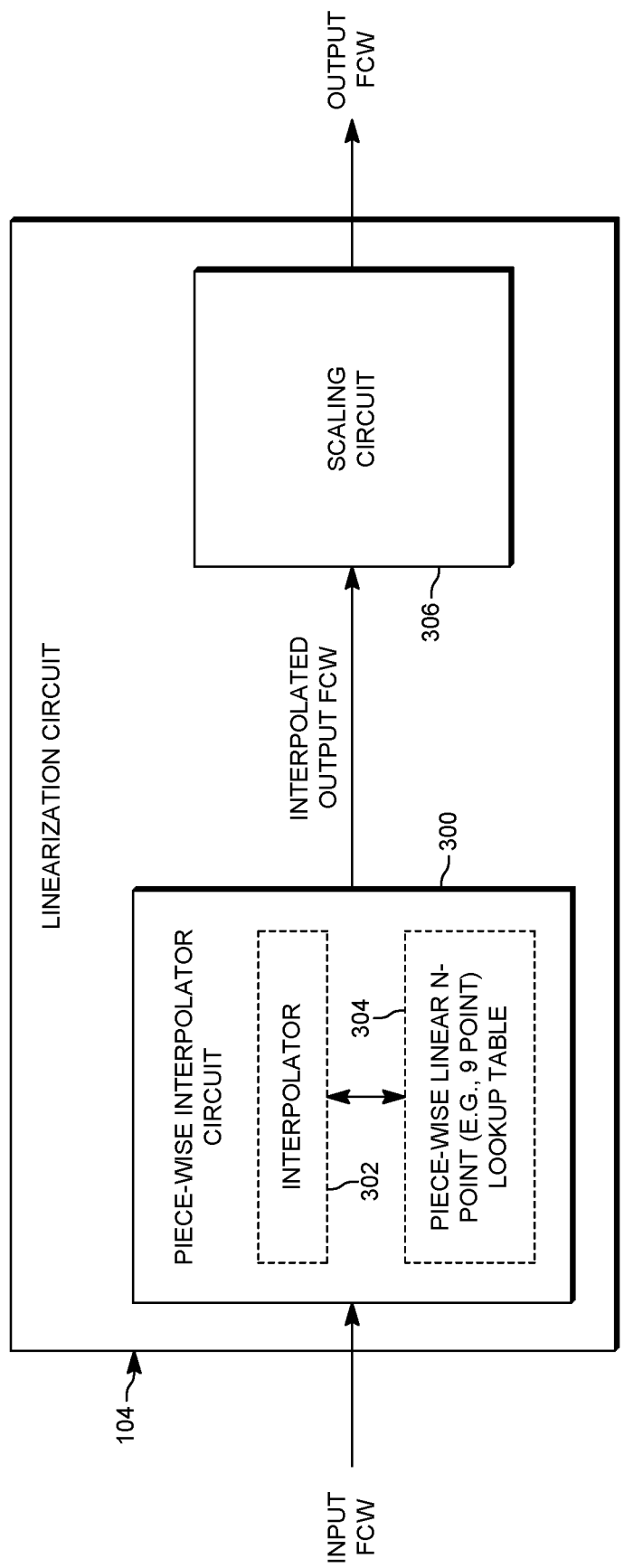
FIG. 6 is a block diagram of the linearization circuit of FIG. 1, in accordance with some embodiments.

As discussed above, in illustrative embodiments, a linearization circuit is provided to adjust an input FCW to be applied to capacitor banks of an oscillator to substantially linearize a frequency response of the oscillator. FIG. 6 is a block diagram of the linearization circuit of FIG. 1, in accordance with some embodiments.

As shown in FIG. 6, in some embodiments, linearization circuit 104 includes a piece-wise interpolation circuit 300 and a scaling circuit 306. The piece-wise linearization circuit 300 further includes an interpolator 302 and a piece-wise linear N-point lookup table (LUT) 304. As illustrated in FIG. 6, the linearization circuit 104 receives an input FCW (such as an input FCW out of the differentiator 102 in FIG. 1) and provides an output FCW to be applied to an oscillator (such as the DCO 106 in FIG. 1).

In operation, the piece-wise linear N-point lookup table 304 in the piece-wise interpolation circuit 300 stores a set of N points that associate N reference output FCWs with a set of frequencies of an oscillator. More specifically, in some embodiments, the LUT 304 is determined using a calibration process that may involve a measurement of a frequency response of an oscillator based on an adjustment of the actual capacitor settings in capacitor banks of the oscillator. In some embodiments, the actual non-linearized frequency response of the oscillator may be measured using a frequency counter.

In some embodiments, to determine the set of reference output FCWs for the associated set of frequencies of the oscillator, the calibration process may involve: (i) selecting a number of desired frequencies, and (ii) for each selected desired frequency of the oscillator: (a) providing an initial FCW (e.g., an 18-bit FCW) to the oscillator and thereafter adjusting the initial FCW by selectively setting capacitance values of multiple capacitor banks of the oscillator so as to cause the oscillator to generate approximately the desired frequency, and (b) setting the adjusted initial FCW as a reference output FCW associated with that desired frequency.

In this regard, the initial FCW corresponds to an "ideal" input FCW, or an input FCW that ideally corresponds to a desired frequency of the oscillator assuming a linear behavior of the oscillator. The initial FCW may be adjusted by searching out a control word that, when applied to the actual capacitor banks of the oscillator, substantially results in a frequency associated with the "ideal" input FCW. In some embodiments, the number of desired frequencies may be determined by dividing, e.g., an operating frequency range of the oscillator into equal segments defined by N points. In one illustrative embodiment, the number (N) of points may be nine (9) points.

Note, however, that although the above-described embodiment assumes equally-spaced set of frequencies, in other embodiments, a desired frequency range may be divided into segments that are not equally spaced. In this regard, some frequency ranges may be determined to be more sensitive or non-linear than others. Hence, it may be desirable to provide additional frequency points that are more closely spaced, etc. As such, more than 9 points may be used. In some embodiments, the ranges may be smaller in areas where the most non-linearity is observed.

Figure 7:
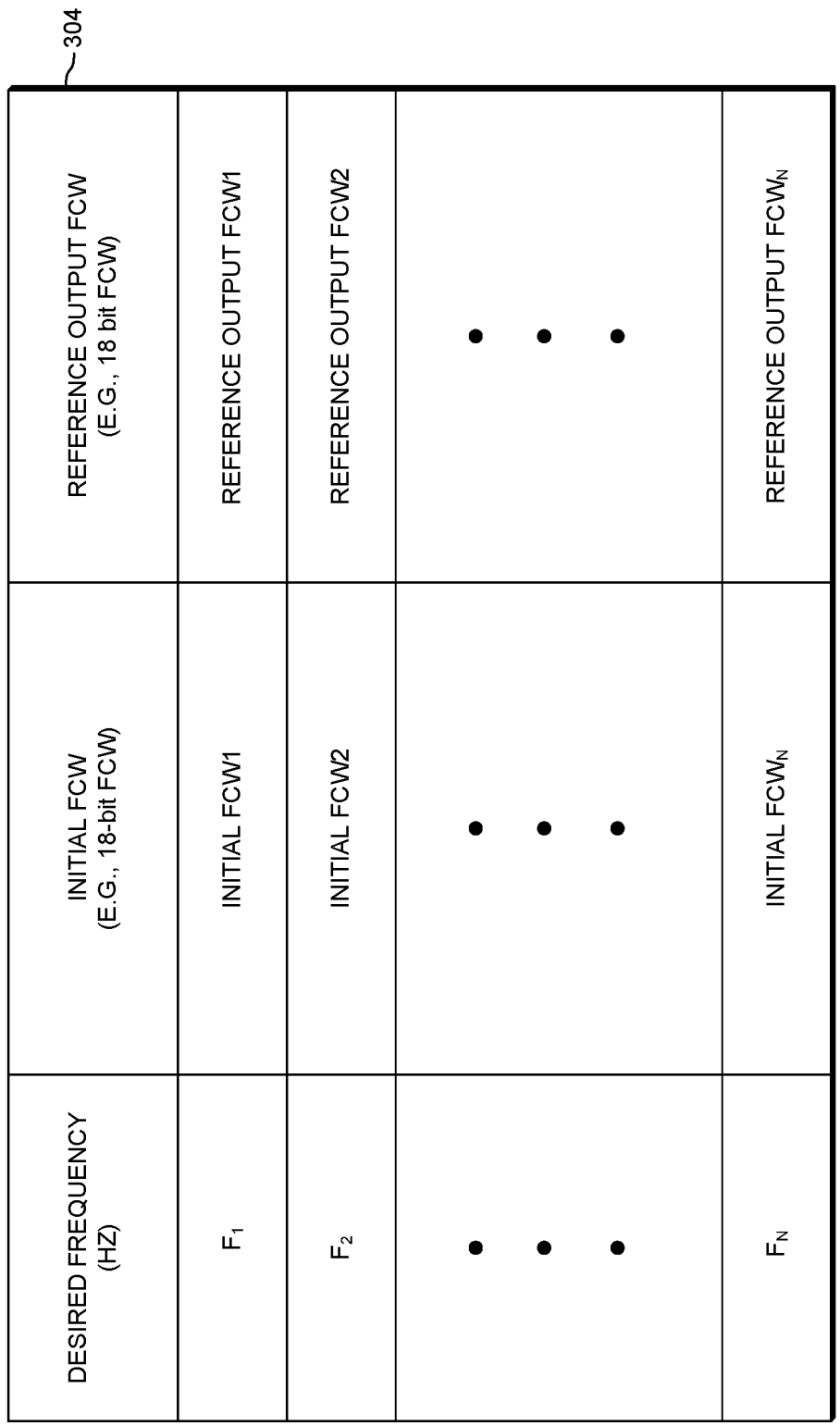
FIG. 7 illustrates an example of the piece-wise linear N-point lookup table.

FIG. 7 illustrates an example of the piece-wise linear N-point lookup table of FIG. 6. As shown in FIG. 7, the table 304 may store variables including "Desired Frequency", "Initial FCW", "and "Reference Output FCW." Alternatively, the Desired Frequency and Initial FCW may be implicitly determined according to the structure or addressing of the table, rather than explicitly stored values. As explained above, the "Initial FCW" corresponds to an "ideal" input FCW, or an input FCW that ideally corresponds to a desired frequency of the oscillator assuming a linear behavior of the oscillator. On the other hand, the "Reference Output FCW" corresponds to the initial FCW adjusted such as to substantially cause the oscillator to output the desired frequency associated with the "ideal" input FCW.

As further shown in FIG. 6, the linearization circuit 300 also includes an interpolator 302. In operation, once an input FCW is applied to the piece-wise interpolation circuit 300, the interpolator 302 may be configured (i) to determine which two reference output FCWs the input FCW falls in between, and (ii) to generate an interpolated output FCW. In some embodiments, the interpolated output FCW may be calculated by the interpolator 302 as a weighted sum of those two reference output FCWs. As one example, depending on how far the interpolated output FCW is from each of the two reference output FCWs, the interpolated output FCW may be, for instance, calculated as a weighted sum in the form of: X % of reference output FCW1 and Y % of reference output FCW2. The use of "%" is easily interpreted according to the binary value of the input FCW, or portion thereof between the two stored points. However, in other embodiments, it may be possible to determine the interpolated output FCW in other way(s).

In some embodiments, the interpolated output FCW may be further provided to the scaling circuit 306. As discussed above, multiple capacitor banks in a tank circuit of an oscillator will typically have different sensitivity characteristics, thus resulting in a non-linear frequency response of the oscillator. When an interpolated output FCW has a remainder portion of bits that correspond to a capacitance resolution (frequency steps) that is finer than what a single capacitor bank can produce, the systems and methods described herein use at least one other capacitor bank that can provide smaller frequency steps. However, another capacitor bank(s) will have different sensitivity characteristic(s). As such, the remainder of bits of the interpolated output FCW needs to be scaled, or normalized, accordingly by the scaling circuit 306.

As discussed above, the piece-wise linear N-point LUT 304 may be determined via a calibration process that uses an actual oscillator frequency response. Similarly, in some embodiments, a sensitivity characteristic of each of multiple capacitor banks may be measured during such calibration process to determine how each bank responds to an incremental addition of capacitors in that bank.

In some embodiments, the scaling circuit 306 (or another element not shown in FIG. 6) may be configured to determine a respective sensitivity characteristic of an individual capacitor bank (e.g., a sensitivity characteristic of any of Banks 0-2, as shown, e.g., in FIG. 3). As a general manner, a sensitivity of each capacitor bank may be determined by selectively measuring two frequency points in response to respective FCWs applied to the capacitor bank.

More specifically, the respective sensitivity may be determined by measuring two frequencies of an oscillator by turning on (i) a first number of capacitors in the capacitor bank to measure one frequency and then (ii) turning on a second number of capacitors in that capacitor bank to measure another frequency. The sensitivity characteristic of the capacitor bank may be then determined based on a difference between the two frequencies and a difference between the first and second number of capacitors.

By way of example, the capacitor bank may be set in the middle of its operating range (such as by turning on half of the capacitors of the bank). Subsequently, the FCW may be increased by five (5) turning off 5 additional caps to shift a frequency lower to measure freq1, and then the FCW may be incremented by 10 (about five FCWs higher from the mid-point) to measure freq2. A frequency change (or delta) is then (freq2−freq1)/10. The result of this calculation would provide a slope, or sensitivity characteristic expressed in terms of a frequency value per capacitor for that particular bank.

In some embodiments, other remaining capacitor bank(s) of the oscillator may be similarly set in the middle of their operating ranges to take into account the non-ideal frequency response due to those capacitor banks.

Further, in some other embodiments, multiple sensitivity characteristics of a particular capacitor bank may be determined, such as in different frequency segments of an oscillator's operating range. In this case, when an input FCW is provided to the linearization circuit 104, and an interpolated FCW may be found within a given frequency output segment as described above and a given sensitivity characteristic that corresponds to that frequency segment may be used during a scaling process performed by the scaling circuit.

Figure 8:
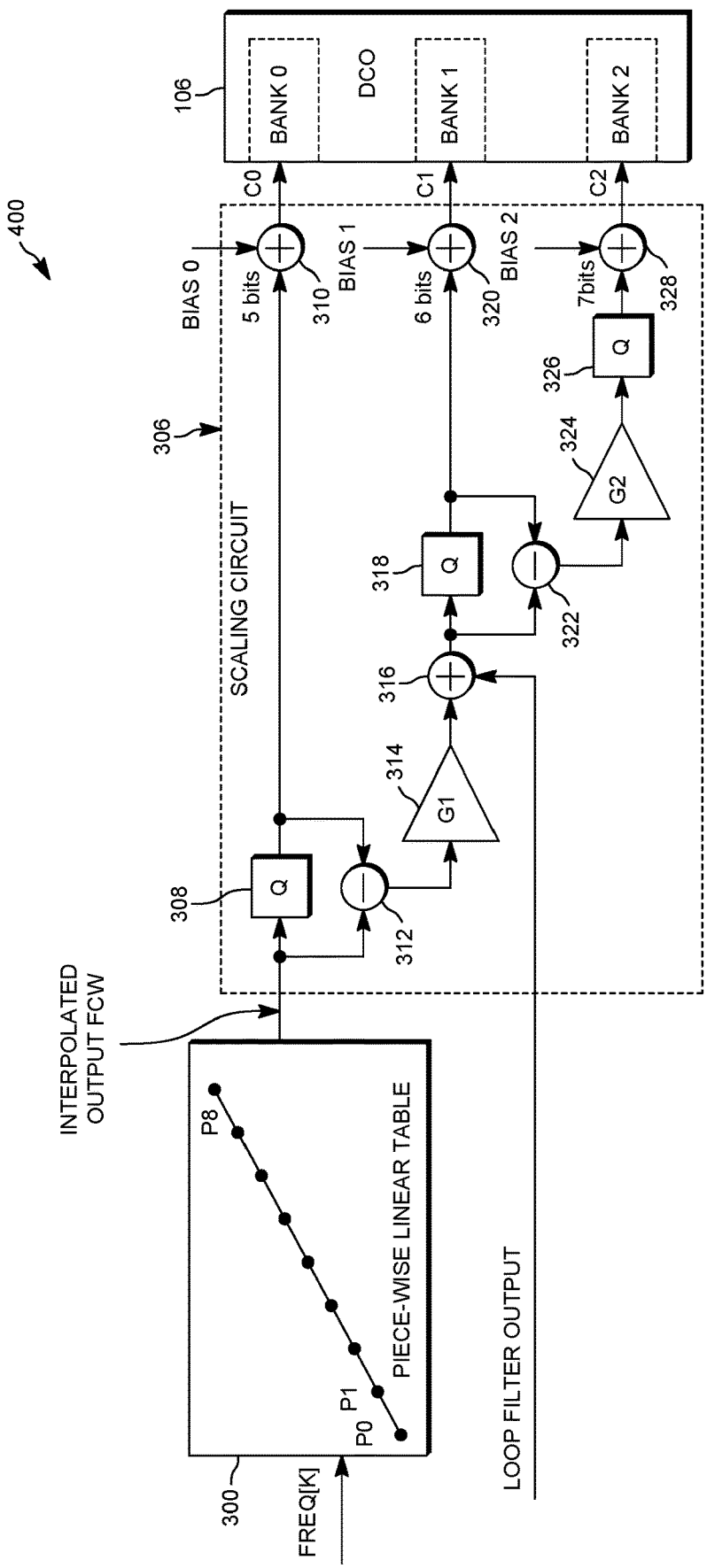
FIG. 8 illustrates one circuit implementation showing further details of the configuration and operation of the linearization circuit of FIG. 6, in accordance with some embodiments.

FIG. 8 illustrates one circuit implementation showing further details of the configuration and operation of the linearization circuit of FIG. 6, in accordance with some embodiments.

As shown in FIG. 8, a circuit 400 includes the linearization circuit 104 including the piece-wise interpolation circuit 300 and the scaling circuit 306. Further, an output of the linearization circuit 104 is applied to the DCO 106 in the form of multiple inputs each carrying a fractional portion (or a set of bits) of the output FCW that respectively controls an associated capacitor bank in the multiple capacitor banks of the DCO 106.

As shown in FIGS. 2 and 3, the DCO 106 includes three capacitor banks Bank 0, Bank 1, and Bank 2 having different sensitivity characteristics and being controlled respectively controlled by 5-bit, 6-bit, and 7-bit fractional portions of the FCW applied to the DCO 106. However, as discussed above, a number of inputs into the DCO 106 may vary based on a number of capacitor banks in the DCO's tank circuit.

As shown, in FIG. 8, an input FCW (expressed in a frequency domain as Freq[k]), which in the present example, may be 18-bit long, is transmitted into the piece-wise interpolation circuit 300, which may responsively output an interpolated output FCW as described above. The interpolated output FCW is also 18-bits long.

As a general matter, in some embodiments, once processed by the linearization circuit 104, the output FCW applied to at least two capacitors banks of oscillator, such as the DCO 106 in FIG. 1, includes a first set of bits corresponding to the most significant bits of an interpolated output FCW and at least one second set of bits determined using a remainder of bits of the interpolated output FCW.

In some embodiments, each second set of bits corresponds to a set of bits obtained by at least scaling the remainder of bits of the interpolated output FCW in accordance with sensitivity characteristics of respective capacitor banks of the at least two capacitor banks.

In this regard, in some embodiments, a given second set of bits is based on (i) a set of bits obtained by scaling the remainder of bits of the interpolated output FCW in accordance with sensitivity characteristics of respective capacitor banks of the at least two capacitor banks and (ii) a phase error signal generated based on an output signal of the oscillator.

The above-noted embodiments will now be described in more detail. In general, the most significant bits of the interpolated output FCW are multiple bits used to change a capacitance of a capacitor bank, in this case the Bank 0, that includes largest-sized capacitors.

As shown in FIG. 8, in some embodiments, however, the most significant bits may be further quantized by a quantizer 308, which functions to strip off a set of bits (i.e., 5 bits as shown in FIG. 8) controlling an associated capacitor bank and round up or down a value of the stripped bits.

More particularly, in one embodiment, the output of the quantizer may be determined as:

$$acq\_q = \text{round}(pwl\_output, \text{number of } acq \text{ bits})$$

where acq_q is the output of the quantizer 308 and pwl_output is an interpolated output FCW obtained from the piece-wise interpolation as discussed. The remainder of bits, i.e., 13 bits, going down to the rest of the scaling circuit 104 may be determined as follows:

$$acq\_residue = pwl\_output - acq\_q;$$

with acq_q being the output of the quantizer, and acq_residue going down to the logic associated with the next capacitor bank, in this case the Bank 1. The acq_residue may be calculated using a subtraction element 312. Additionally, the set of 5 bits rounded by the quantizer 308 is fed into a summation element 310 (e.g., an adder) that sums the 5-bit word with a bias 0 signal to produce a final set of 5 bits applied to the Bank 0 of the DCO 106. Note that the FCW words represent a deviation frequency with respect to the carrier frequency. The DCO is configured with the carrier frequency as determined by a base FCW component set by signals bias 0, bias, 1, and bias 2.

The remaining 13 bits going down to the rest of the scaling circuit 104 represent a fractional portion of a frequency step of the Bank 0. i.e., a portion controlled by smaller-resolution capacitors in other two capacitor banks, the Bank 1 and the Bank 2.

However, given that the next adjustment made in an attempt to arrive at a desired DCO frequency will involve setting of lower bits between frequency steps of the Bank 0 (i.e., Bank 0 steps are too coarse, hence a need to use bank(s) with smaller caps), a slope, or sensitivity characteristic, of that capacitor bank (or the bank with largest-sized capacitors) must be used to correct those remaining bits.

More particularly, a remainder of bits (i.e., 13 bits) (or residue) output by the element 312 is passed down to a logic associated with the next smaller-sized capacitor bank. To properly interpolate the remaining bits (i.e., those bits left after stripping off the five most significant bits), the remainder of the output FCW is first normalized by multiplying the remainder of bits by a gain element G1 314 that represents the following ratio:

$$G1 = \text{Sensitivity Characteristic of Bank 1/Sensitivity Characteristic of Bank0}$$

In other words, this normalization is performed by dividing the remainder of bits by the Bank 0 sensitivity characteristic (or slope of its frequency response, referred to as G0, which may be measured during calibration) to remove its effect and then multiplying the result by the sensitivity characteristic of the next capacitor bank, which in the present example, is a Bank 1 sensitivity characteristic. In general, this calculation provides actual capacitance values properly interpolated according to the Bank 1 slope.

With respect to the bits controlling capacitors in the Bank 1, in some embodiments, a result output by the G1 element 314 may be further fed into a summation element 316 (e.g., an adder), which combines the normalized 13-bit remainder with the filtered error signal out of the loop filter 112, as shown in FIG. 1.

Hence, prior to being quantized by a quantizer 318, the filtered error signal generated based on the output signal of the DCO 106 is added to the scaled remainder of bits, or a second set of bits.

Note that an error signal indicating a difference in phase between a phase of the DCO and a phase of a reference signal will likely be relatively small. Hence, its contribution will need to be taken into account with respect to adjusting capacitance (and hence DCO output frequency) of capacitor banks providing finer capacitance resolution. In the embodiments shown, the phase error signal is injected so as to effect Banks 1 and 2. For example, in other embodiments, it may be possible that the error signal may contribute to a value of a portion of the output FCW that controls only Bank 2 providing only finer capacitance resolution to control frequency output accordingly.

The result output by the summation element 316 is fed into the quantizer 318, which functions to strip off a set of bits (i.e., 6 bits as shown in FIG. 8) controlling an associated capacitor bank and round up or down a value of the stripped bits. A summation element 320 (e.g., an adder) and a subtraction element 322 may operate in the same way as described in connection with the Bank 0 of the DCO 106.

The remaining 7 bits out of the subtraction element 322 going down to the rest of the scaling circuit 306 represent a fractional portion of a frequency step of the Bank 1, i.e., a portion controlled by smaller-resolution capacitors in the remaining Bank 2. In embodiments with a third capacitor bank made up of even finer capacitor values, such as in the present embodiment described herein, a third sensitivity characteristic or a slope of that bank's frequency response may exist. The least significant bits remaining after the interpolation and scaling of the previous capacitor bank must be first normalized to remove the slope of the Bank 1 from the interpolation of the fractional step of the Bank 1 and then the bits may be interpolated according to the slope of the Bank 2 capacitor bank.

As in the case of the Bank 1 described above, the remaining 7 bits may be multiplied by a gain element G2 324 that represents the following ratio:

G2=Sensitivity Characteristic of Bank 2/Sensitivity Characteristic of Bank1

After normalization, the output of the G2 element 324 is fed into a quantizer 326 that may round up or down the remaining 7 bits accordingly. A summation element 328 (e.g., an adder) may operate in the same way as described in connection with other capacitor banks of the DCO 106. Note that using the outputs of the linearization circuit, the original interpolated FCW $p_i$ may be represented as:

$$p_i = c0_i + \frac{1}{G1}\left(\frac{c2_i}{c1_i} + c2_i\right),$$

where $c0_i$ is the codeword portion for Bank 0, $c1_i$ is the codeword portion for Bank 1, and $c2_i$ is the codeword portion for Bank 2.

Note that, in some embodiments, various logic associated with the linearization circuit 104 may implemented using VHSIC Hardware Description Language (VHDL) or a similar language. Those skilled in the art would be familiar on how to use such language to implement various functions described herein. However, in other embodiments, other implementations may be possible.

Figure 9:
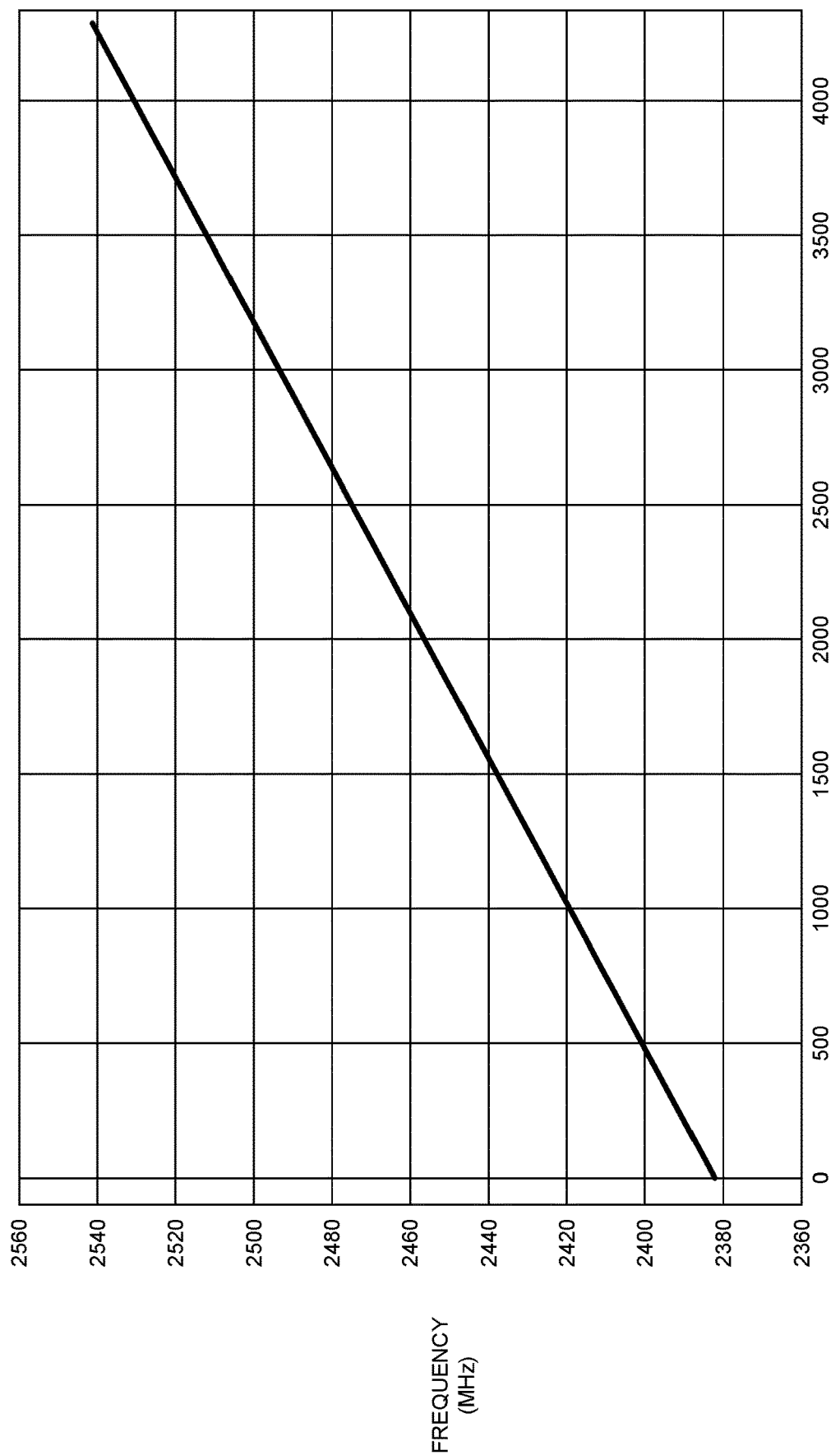
FIG. 9 illustrates a frequency response of the DCO after linearization of the FCW.

As a result of the linearization process carried out by the linearization circuit, non-linearities in a frequency response of the DCO 104 may be alleviated. Referring back to FIG. 4, a DCO frequency response was relatively non-linear due to non-ideal behavior caused at least in part by different sensitivity characteristics of multiple DCO capacitor banks and prior to an FCW input into the oscillator being linearized. In contrast, FIG. 9 is a plot showing a frequency response of a DCO as a result of processing performed by a linearization circuit of the present disclosure. As shown in FIG. 9, an FCW applied to the oscillator has been adjusted such that the frequency response of the oscillator has been substantially linearized.

FIG. 9 illustrates the linearized output behavior of the DCO. FIG. 10 depicts the phase signal processing used to generate the inputs to the linearization circuit for one particular embodiment of a DCO. Note that any DCO (even a single point injection system) may beneficially utilize the linearization system and method described herein.

Figure 11:
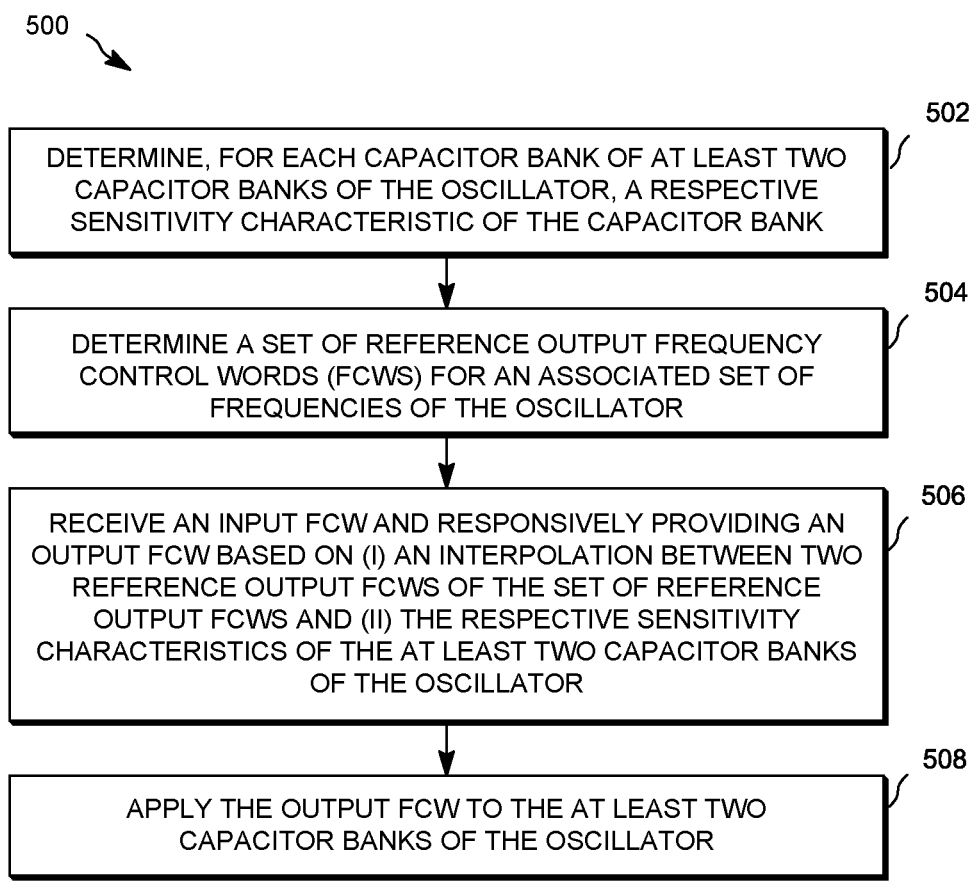
FIG. 11 is a flow diagram illustrating a method of linearizing a frequency response of an oscillator controlled by a plurality of capacitor banks, in accordance with some embodiments.

FIG. 11 is a flow diagram illustrating an example method 500 of linearizing a frequency response of an oscillator controlled by a plurality of capacitor banks, in accordance with some embodiments. Step 502 involves determining, for each capacitor bank of at least two capacitor banks of the oscillator, a respective sensitivity characteristic of the capacitor bank. Step 504 involves determining a set of reference output frequency control words (FCWs) for an associated set of frequencies of the oscillator. Further, step 506 involves receiving an input FCW and responsively providing an output FCW based on (i) an interpolation between two reference output FCWs of the set of reference output FCWs and (ii) the respective sensitivity characteristics of the at least two capacitor banks of the oscillator. Finally, step 508 involves applying the output FCW to the at least two capacitor banks of the oscillator.

Referring now to the example phase-locked loop modulator circuit 100 of FIG. 1, as described above, an oscillator output signal from the DCO 106 is fed back to the frequency divider 108, which is, in some embodiments, an MMD. The frequency divider 108 divides the frequency of the oscillating signal by a frequency divisor N to generate a frequency divided signal, which is, in turn, input to the TDC 110. In, for example, a portion of the feedback path from the DCO 106 to the frequency divider 108, the oscillator output signal may in general experience an analog loop delay, which may be referred to as a tau value τ. This analog loop delay value τ may be estimated through, e.g., simulation. In some examples, assuming a clock cycle of, e.g., 6.25 ns, an analog loop delay value τ around 2 ns might be estimated, although this is an example and other delay values are possible, depending on an implementation.

Such an analog signal processing delay in the feedback path may ultimately cause the signal from the TDC 110 and the loop filter 112 to be delayed coming into the linearization circuit 104 and in combining with the input FCW from the differentiator 102. This delay may result in a timing mismatch of values such that the error signal from the digital portion of the feedback loop (e.g., from TDC 110 and the summation element 116 and the loop filter 112) may not be accurate in time with the incoming input FCW from the differentiator 102, resulting in a less accurate error adjustment and DCO 106 adjustment.

In some embodiments, a delay compensation cell (DCC), not shown in FIG. 1, may be employed, e.g., between the differentiator and the linearization circuit 104. In some embodiments, the delay compensation cell (DCC) may be implemented as a linear interpolator, providing a weighted average of successive values of the input FCW output from the differentiator 102. In some embodiments, the input FCW may be effectively delayed by the delay compensation cell (DCC) (e.g., interpolator) as a weighted sum of an initial value of the input FCW and a subsequent value of the input FCW. A control value may be used at the delay compensation cell to set the values of the weighted sum. As one example, the delayed input FCW may be, for instance, calculated as a weighted sum in the form of: X % of initial value of the input FCW at time n and Y % of a subsequent value of the input FCW at time n+1. However, in other embodiments, it may be possible to determine the delayed input FCW out of the delay compensation cell (DCC) in other way(s).

In some embodiments, the delay compensation cell (DCC) such as an interpolator may be used to align an input FCW output with an output of the loop filter and the effective delay set by the delay compensation cell may be set in accordance with the estimated analog loop delay τ.

Use of a delay compensation cell (DCC) such as an interpolator alone to compensate for an observed analog loop delay and to provide a sub-clock frequency alignment, may be effective for certain phase values but perhaps less effective to capture quick changes in the baseband phase input or frequency at the output of the differentiator 102. At low frequencies, the use of the DCC such as an interpolator alone may provide an effective fractional delay. In some implementations, using the DCC such as interpolator alone may cause distortion, due to, e.g., loss of capturing higher frequency components of the delayed signal. In some embodiments, more precise methods of compensating for the observed analog loop delay through the feedback path (thus resulting in an alignment of the input FCW with the output of the loop filter or, ultimately, a delayed output FCW into the DCO 106) might be advantageous to faithfully (or more faithfully) capture a wider range of changes in the baseband phase and the resulting input FCW from the differentiator 102.

Figure 12:
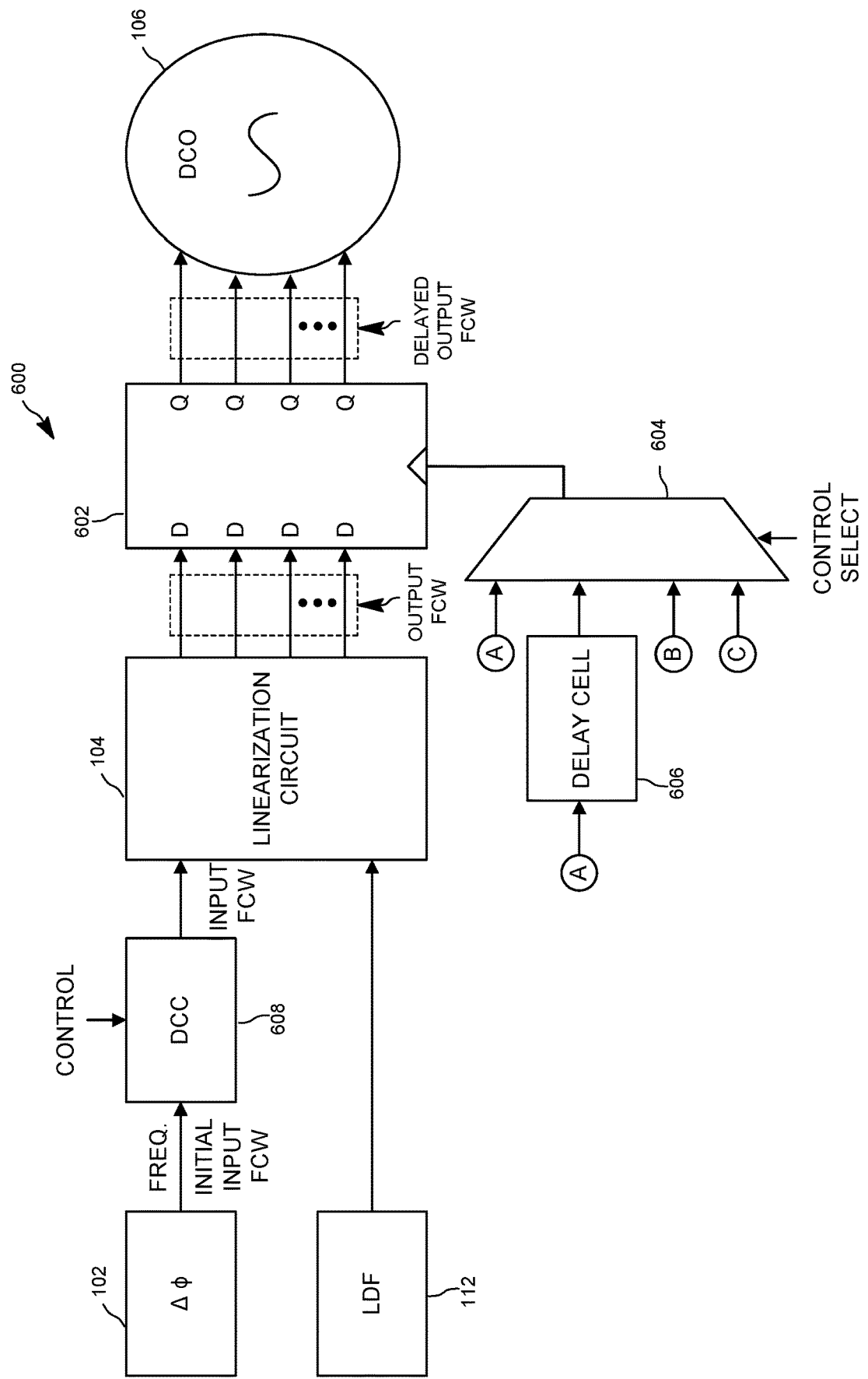
FIG. 12 is a block diagram of a portion of an example phase-locked loop modulator circuit configuration including an example clocked delay cell, in accordance with some embodiments.

FIG. 12 is a block diagram of a portion of an example phase-locked loop modulator circuit configuration including an example clocked delay cell, in accordance with some embodiments. Referring to FIG. 12, the portion of the example phase-locked loop modulator configuration 600 is an example implementation of the configuration 100 of FIG. 1, in accordance with some embodiments. The example phase-locked loop configuration 600 includes the reference oscillator 114, the TDC 110, the summation element 116, and the frequency divider 108, which for simplicity are not shown in FIG. 12. In addition to the differentiator 102, the linearization circuit 104, the DCO 106, and the loop filter 112 shown in FIG. 12, the example phase-locked loop configuration 600 includes, in accordance with some embodiments, several examples of different example circuits to address loop timing mismatches that may be caused by, e.g., analog loop delay as described above. The example phase-locked loop configuration 600 may include, in accordance with some embodiments, a delay compensation cell (DCC) 608, which may be implemented as an interpolator 608; a clocked delay cell 602, which may be implemented by, e.g., a series of clocked D flip-flops (shown as a grouped cell for simplicity in FIG. 12); an input clock selection circuit 604 such as a multiplexer 604, for example; and a delay cell 606. The particular circuit blocks used are merely examples, for example, the linearization circuit 104 is shown for ease of understanding and explanation in FIG. 12 but may be removed or not included in other example embodiments.

Example operation of the example phase-locked loop configuration 600 of FIG. 12 may proceed in certain similar respects to the example configuration of FIG. 1. In operation, a differentiator 102 is configured to receive an input phase signal and take a time differential of the phase signal to generate a differentiated phase signal corresponding to an input frequency control word (FCW) (as denoted in FIG. 12). In illustrative embodiments, the frequency values output by the differentiator 102 may be in the form of N-bit digital codewords, or more specifically input FCWs (e.g., 18-bit FCWs) that, ideally, correspond to the differentiated phase values for controlling the DCO 106 so as to generate an output signal with a desired frequency. In the example configuration 100 of FIG. 1, the input FCW is, e.g., then provided to the linearization circuit 104 that is operative to adjust the input FCW and produce an output FCW (as denoted in FIG. 1) that is applied to the DCO 106.

As in FIG. 1, the DCO 106 includes a tank circuit having multiple capacitor banks that are digitally controlled in accordance with the output FCW provided out of the linearization circuit 104. As in FIG. 1, an oscillating signal with a desired frequency may be generated by the DCO, where the frequency is determined by reactive components within the DCO, which are in turn controlled by the FCW. The oscillator output signal is fed back to the frequency divider 108 (not shown in FIG. 12), which divides the frequency of the oscillating signal by a frequency divisor N to generate a frequency-divided signal. As in FIG. 1, the example phase-locked loop configuration 600, includes the reference oscillator 114 (not shown in FIG. 12), which may provide a reference signal (e.g., a clock signal) as an input to the TDC 110 (not shown in FIG. 12) operative to compare a phase of the frequency-divided signal out of the frequency divider 108 with a phase of the cyclic reference signal to generate a measured phase signal.

As in FIG. 1, the phase-locked loop configuration 600 also includes the summation element 116. According to the example operation, the summation logic 116 is operative to sum the wrapped-phase input signal with the measured phase signal to generate an error signal. The error signal represents a difference between the phase of the oscillating signal from the DCO 106 and the wrapped-phase input signal. When the signal from the DCO 106 has a phase equal to the phase indicated by the wrapped-phase input signal, the error signal is substantially equal to zero. When the signal from the DCO 106 has a phase different from the phase indicated by the wrapped-phase input signal, the error signal contributes to a control signal that controls the DCO 106.

As in FIG. 1, the error signal is filtered by the loop filter 112, to generate a filtered error signal that is in turn provided as an input to the linearization circuit 104. As described with respect to FIG. 1, the example phase-locked loop configuration 600 of FIG. 12, in some embodiments, the filtered error signal contributes to at least a portion of the output FCW generated by the linearization circuit 104 (e.g., in embodiments in which a circuit such as linearization circuit 104 is included) in order to control a frequency of the DCO 106.

The example configuration 600 of FIG. 12 differs in certain respects from the example of FIG. 1. In the example configuration 600 of FIG. 12, a delay compensation cell (DCC) 608 is placed between the differentiator 102 and the linearization circuit 104. In FIG. 12, the DCC 608 is shown external to the differentiator 102 but in some embodiments, the DCC 608 may be implemented as part of the differentiator, for example as variable delay stages as shown in FIG. 10 (showing an example block diagram of a differentiator such as differentiator 102). The DCC 608 may be implemented as an interpolator 608 to, e.g., interpolate between successive initial input FCWs to determine an input FCW for, e.g., the linearization circuit 104.

The DCC 608 may have one or more control inputs to receive a control signal (such as "CONTROL" in FIG. 12). Such a control signal may be, for example, weights used to interpolate between successive initial input FCWs.

In some embodiments, control may be set for the DCC 608 (e.g., an interpolator) following, e.g., pre-implementation testing of a chip. In other embodiments, control may be automatically configurable rather than set beforehand for a particular design.

In some embodiments, the DCC 608 may be operative to delay an initial input FCW to determine an input FCW that is, e.g., aligned in time with the filtered error signal from the loop filter 112. As described above, the filtered error signal may be delayed in time by an amount of an analog loop delay from the feedback loop from, e.g., the DCO 106 to the frequency divider 108.

In some embodiments, for, e.g., performance or other concerns specific to certain implementations, the DCC 608 may be set to provide less than a full, or even only a slight adjustment to, e.g., a larger delay correction for an estimated analog loop delay. In some embodiments, the DCC 608 may be configured to thus supplement, e.g., the clocked delay cell 602 in attempting to account for an estimated analog loop delay.

In the example configuration 600 of FIG. 12, a clocked delay cell 602 is located between the linearization circuit 104 and the DCO 106. The clocked delay cell 602 may receive an output FCW from the linearization circuit 104 and may (e.g., temporarily) store the output FCW until receiving a trigger signal (e.g., a rising edge or a falling edge trigger) from an input clock (e.g., provided by itself, or, e.g., by an input clock selection circuit 604 as shown in FIG. 12). The clocked delay cell 602 may then provide a delayed output FCW to the DCO 106. In some embodiments, the clocked delay cell 602 may be implemented by, e.g., a series of clocked D flip-flops (shown as a grouped cell for simplicity in FIG. 12). In general, as opposed to the simplified cell 602 shown in FIG. 12, a respective clocked D flip-flop may be used for each respective bit of a N-bit FCW.

In the example configuration 600 of FIG. 12, an input clock selection circuit 604 such as a multiplexer 604 provides an input clock to the clocked delay cell 602. Of course, in some embodiments, input clock selection may not be used and the clocked delay cell may directly receive an input clock, e.g., some sort or type of modified system clock. As shown in the example of FIG. 12, the input clock selection circuit 604 receives "modified" system clock signals "B" and "C" from, e.g., an example on-chip clock distribution layout or scheme, an example of which is shown in FIG. 14.

Figure 14:
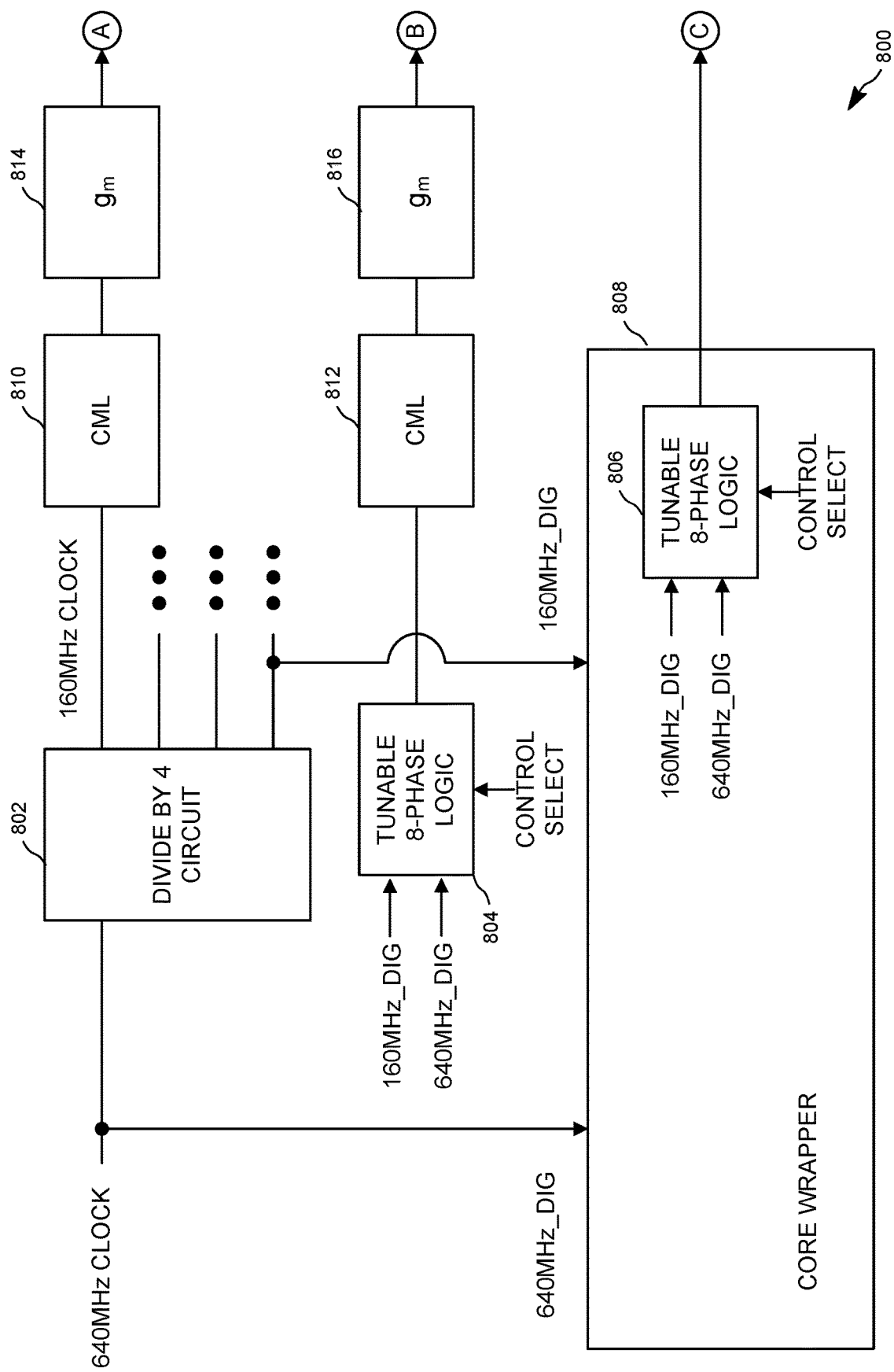
FIG. 14 is a block diagram showing an example on-chip clock distribution scheme in accordance with some embodiments.

The example configuration 600 of FIG. 12, in accordance with some embodiments, further includes a delay cell 606 that, e.g., receives a system clock "A" from, e.g., the example on-chip clock distribution layout or scheme of FIG. 14. The delay cell 606 provides, e.g., multiple versions of the system clock as a "modified" system clock to the input clock selection circuit 604, e.g., the multiplexer 604.

Finally, according to the example shown in FIG. 12, the input clock selection circuit 604, e.g., the multiplex 604 directly receives (e.g., without an intervening delay such as a delay cell 606) the system clock "A" from, e.g., the example on-chip clock distribution layout or scheme of FIG. 14.

In some embodiments, the system clock "A" may also be provided to the linearization circuit 104 (and the example phase-locked loop configuration 600 generally may operate off of the system clock signal "A").

The input clock selection circuit 604, e.g., the multiplexer 604 may have one or more control inputs to receive a control signal (such as "CONTROL SELECT" in FIG. 12). Such a control signal may be, for example, a multi-bit codeword representing 0:N to select between up to N options.

In some embodiments, control may be set for the input clock selection circuit 604, e.g., the multiplexer 604, following, e.g., pre-implementation testing of a chip. In other embodiments, control may be automatically configurable rather than set beforehand for a particular design.

Figure 13:
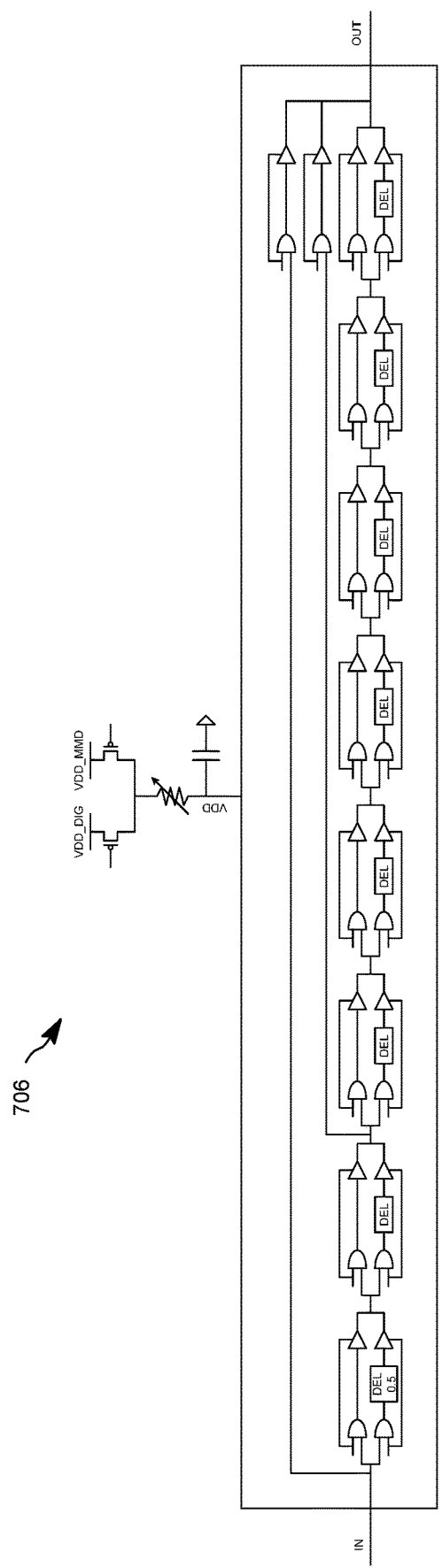
FIG. 13 illustrates an example circuit implementation showing further details of the delay cell of FIG. 12, in accordance with some embodiments.

FIG. 13 illustrates an example circuit implementation 706 showing further details of the delay cell 606 of FIG. 12, in accordance with some embodiments. In general, the example delay cell 706 of FIG. 13 shows a series of cascaded delays applied to an input signal "IN" (e.g., a system clock signal "A"), which provide a respective series of options for a delayed, modified, system clock, with an output signal "OUT" being, e.g., applied to an input of the input clock selection circuit 604 (e.g., multiplexer 604) of FIG. 12.

An example method in accordance with some embodiments may include: determining an output frequency control word (FCW) having a plurality of bits, the output FCW being configured to control an oscillator of a phase-locked loop circuit, the oscillator comprising a plurality of capacitor banks, the plurality of capacitor banks respectively corresponding to the plurality of bits of the output FCW. The example method may further include storing the output FCW in a clocked delay cell, wherein the clocked delay cell comprises a series of D flip-flops. The example method may further include providing an input clock to the clocked delay cell, wherein the input clock is provided to delay the output FCW by an amount of delay based on a clock period of the input clock minus an estimated loop delay in a portion of the phase-locked loop circuit. The example method may further include, in accordance with the input clock, releasing the delayed output FCW from the clocked delay cell, and respectively applying the plurality of bits of the delayed output FCW to the plurality of capacitor banks of the oscillator.

In some embodiments, the input clock is provided to the clocked delay cell such that an input phase and an error correction signal (e.g., a phase error signal generated based on an output signal of the oscillator) are ultimately aligned in time in contributing to the output FCW and to ensure that the output FCW is provided to the DCO on a clock transition of the input clock.

In some embodiments, providing the input clock (e.g., to the clocked delay cell) may include providing a modified system clock as the input clock.

In some embodiments, providing the input clock may include providing a selected modified system clock as the input clock from a plurality of modified system clock options.

In some embodiments, determining the output FCW may include receiving an input FCW and responsively providing the output FCW.

In some embodiments, receiving the input FCW may further include determining the input FCW by interpolating between successive values of an initial input FCW.

In some embodiments, receiving the input FCW and responsively providing the output FCW may further include receiving the input FCW and responsively providing the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

In some embodiments, determining the output FCW may further include determining the plurality of sensitivity characteristics by determining, for each capacitor bank of the plurality of capacitor banks of the oscillator, a respective sensitivity characteristic of the capacitor bank; and determining the set of reference output FCWs for an associated set of frequencies of the oscillator.

In some embodiments, the respective sensitivity characteristic of the capacitor bank may indicate a change in a frequency of the oscillator that occurs as a result of an incremental addition of each capacitor in the capacitor bank.

In some embodiments, determining, for each capacitor bank of the plurality of capacitor banks of the oscillator, the respective sensitivity characteristic of the capacitor bank may include: measuring first and second frequencies of the oscillator by turning on (i) a first number of capacitors in the capacitor bank to measure the first frequency and (ii) a second number of capacitors in the capacitor bank to measure the second frequency; and determining the respective sensitivity characteristic of the capacitor bank based on a difference between the first and second frequencies and a difference between the first and second number of capacitors.

In some embodiments, determining the set of reference FCWs for the associated set of frequencies of the oscillator may include: selecting a number of desired frequencies of the oscillator; and, for each desired frequency of the oscillator, providing an initial FCW to the oscillator and thereafter adjusting the initial FCW by selectively setting capacitance values of the at least two capacitor banks of the oscillator so as to cause the oscillator to generate approximately the desired frequency; and setting the adjusted initial FCW as a reference output FCW associated with the desired frequency.

An example circuit in accordance with some embodiments may include an oscillator circuit, a frequency control word (FCW) processing circuit, a clocked delay cell, and an input clock selection circuit. In some embodiments, the oscillator circuit may include a tank circuit having a plurality of capacitor banks. In some embodiments, the FCW processing circuit may be configured to determine an output FCW having a plurality of bits, the output FCW being configured to control the oscillator of a phase-locked loop circuit, wherein the plurality of capacitor banks of the oscillator respectively correspond to the plurality of bits of the output FCW. In some embodiments, the clocked delay cell may be configured to store the output FCW, wherein the clocked delay cell comprises a series of D flip-flops. In some embodiments, the input clock selection circuit configured to provide an input clock to the clocked delay cell, wherein the input clock is provided to delay the output FCW by an amount of delay based on a clock period of the input clock minus an estimated loop delay in a portion of the phase-locked loop circuit. In some embodiments, the clocked delay cell may be further configured to, in accordance with the input clock, release the delayed output FCW from the clocked delay cell and respectively apply the plurality of bits of the delayed output FCW to the plurality of capacitor banks of the oscillator.

In some embodiments, the input clock selection circuit may include a multiplexer circuit. The multiplexer circuit may be configured to provide, from one or more modified system clock options, a selected modified system clock as the input clock to the clocked delay cell. The multiplexer circuit may be configured to receive a selection of the modified system clock at a select input of the multiplexer circuit.

In some embodiments, the FCW processing circuit may include a linearization circuit. The linearization circuit may be coupled to the clocked delay cell. In some embodiments, the linearization circuit may be operative to receive an input FCW and responsively provide the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

In some embodiments, the example circuit may further include a delay compensation cell configured to determine the input FCW by interpolating between successive values of an initial input FCW.

FIG. 14 is a block diagram showing an example on-chip clock distribution scheme 800 in accordance with some embodiments. Referring to FIG. 14, an example beginning with a "main" system clock of 640 MHz is shown, with frequency divided generated clocks of 160 MHz. It will be understood that these are merely examples and that other clocks, clock layouts, clock distribution schemes, and other clock frequencies may be used.

An example list of terminology for example clocks/clock signals (with example, non-limiting clock frequencies) as shown in FIGS. 12 and 14:

"Main" system clock—640 MHz clock
Generated, e.g., by a ring oscillator, main clock for chip
System clock—160 MHz clock at "A".
Generated locally to the "Main" system clock, one of four clocks distributed through the chip
Distributed across the chip to the phase-locked loop
Modified system clock "analog"—tunable 160 MHz clock at "B"
Generated from a tunable 8-phase logic circuit, e.g., locally to the "System clock" and distributed across the chip to the phase-locked loop
Modified system clock "digital"—tunable 160 MHz clock at "C"
Generated from a tunable 8-phase logic circuit, locally to the phase-locked loop, e.g., from a routed version of the "System clock" through the "core wrapper"
Delayed system clock—160 MHz clock delayed by Delay Cell 606 of FIG. 12
Delayed version of the System Clock ("A")
(Selected) input clock—160 MHz input clock as output by input clock selection circuit 604 (e.g., multiplexer 604) and provided to the clocked delay cell 602.
The output of the input clock selection circuit.

Use of terms such as "local" or "remote" refers to relative distance on-chip with respect to, e.g., a main circuit block (such as a DPLL (digital phase-locked loop)). Since the distances being referred to are microscopic, local or remote are relative terms, with X being "local" to Y implying more relative proximity between X and Y, and vice versa; and V being "remote" from W implying more relative distance, perhaps implying more relative routing and distribution of signals, such as clock signals, between V and W, and vice versa.

In example operation, a "Main" system clock of 640 MHz "640 MHz CLOCK" is generated, e.g., by a ring oscillator. In some embodiments, this clock may be "a" or even "the" primary clock for a single chip design.

The main system clock is applied to a Divide-By-4 frequency divider circuit 802, with four clocks, each at 160 MHz, being generated from the divider 802. One 160 MHz clock is provided to current mode logic (CML) 810 to be transmitted across the chip to a DPLL such as the example phase-locked loop configurations 100, 600 of FIGS. 1 and 12, respectively. The clock comes out of a transconductance stage $g_m$ 814 (and, e.g., a CML load not shown) as "System Clock" "A" at 160 MHz, the operating clock for the DPLL (e.g., 100, 600). A fourth clock of the four clocks output from the divider 802 goes to a Core Wrapper 808 adjoining or surrounding the (e.g.) system-on-chip (SoC) as "160 MHz_DIG".

The main system clock (as "640 MHz_DIG"), as well as the fourth clock from the divider 802 (as "160MHz_DIG"), are provided to a tunable 8-phase logic circuit stage 804. The tunable 8-phase logic circuit stage 804 is configured to receive a control signal "CONTROL SELECT", e.g., a three-bit control signal [0:7] that can select from one of eight separate clock outputs. The "Modified" system clock output of 160 MHz is provided to current mode logic (CML) 812 to be transmitted across the chip to a DPLL such as the example phase-locked loop configurations 100, 600 of FIGS. 1 and 12, respectively. The clock comes out of a transconductance stage $g_m$ 816 (and, e.g., a CML load not shown) as "Modified system clock 'analog'" at "B", the tunable 160 MHz clock at "B", generated remotely from the DPLL (e.g., 100, 600).

The main system clock is also provided as a "640 MHz_DIG" signal to the Core Wrapper 808 adjoining or surrounding the (e.g.) system-on-chip (SoC). From the Core Wrapper 808, at, e.g., a (relatively speaking) more local distance to the DPLL (e.g., 100, 600), the main system clock (as "640 MHz_DIG"), and the fourth clock from the divider 802 (as "160 MHz_DIG"), as both routed and distributed across the chip in the Core Wrapper 808, are both provided to a (e.g., second) tunable 8-phase logic circuit stage 806. The tunable 8-phase logic circuit stage 806 is configured to receive a control signal "CONTROL SELECT", e.g., a three-bit control signal [0:7] that can select from one of eight separate clock outputs. The "Modified" system clock output of 160 MHz comes out of the stage 806 as "Modified system clock 'digital'" at "C", the tunable 160 MHz clock at "C", generated locally to the DPLL (e.g., 100, 600).

In some embodiments, the tunable 8-phase logic circuit stage is implemented identically to stage 806, although it will be understood that other designs are possible. The "CONTROL SELECT" signals into 804, 806, may be set independently based on a particular design.

In some embodiments, control (e.g., control signals such as respective "CONTROL SELECT" signals) may be set for the tunable 8-phase logic circuit stages 804, 806, following, e.g., pre-implementation testing of a chip. In other embodiments, control may be automatically configurable rather than set beforehand for a particular design.

In some embodiments, a clock distribution scheme or layout such as layout 800 may advantageously provide different options for (e.g., modified) system clocks having different phases.

In some embodiments, providing the input clock (e.g., to the clocked delay cell) may include providing a modified system clock as the input clock.

In some embodiments, the modified system clock may include a system clock designed for the phase-locked loop circuit.

In some embodiments, the modified system clock may include a delayed system clock provided from a second delay cell. The second delay cell may be configured to apply a second delay to a system clock designed for the phase-locked loop.

In some embodiments, the modified system clock may include a selected system clock provided from a tunable multi-phase circuit.

In some embodiments, the tunable multi-phase circuit is local to the phase-locked loop circuit and the selected system clock is provided from the tunable multi-phase circuit from a system clock.

In some embodiments, the tunable multi-phase circuit is located remotely from the phase-locked loop circuit and the selected system clock is provided from the tunable multi-phase circuit locally to a system clock and the selected system clock is distributed across a chip to the phase-locked loop circuit.

In some embodiments, providing the input clock may include providing a selected modified system clock as the input clock from a plurality of modified system clock options.

In some embodiments, the plurality of modified system clock options may include two or more of: a system clock designed for the phase-locked loop circuit, a delayed system clock provided from a second delay cell, the second delay cell configured to apply a second delay to the system clock designed for the phase-locked loop circuit, a first selected system clock provided from a first tunable multi-phase circuit, wherein the first tunable multi-phase circuit is local to the phase-locked loop circuit, and a second selected system clock provided from a second tunable multi-phase circuit, wherein the second tunable multi-phase circuit is located remotely from the phase-locked loop circuit and the selected system clock is distributed across a chip to the phase-locked loop circuit.

Figure 15:
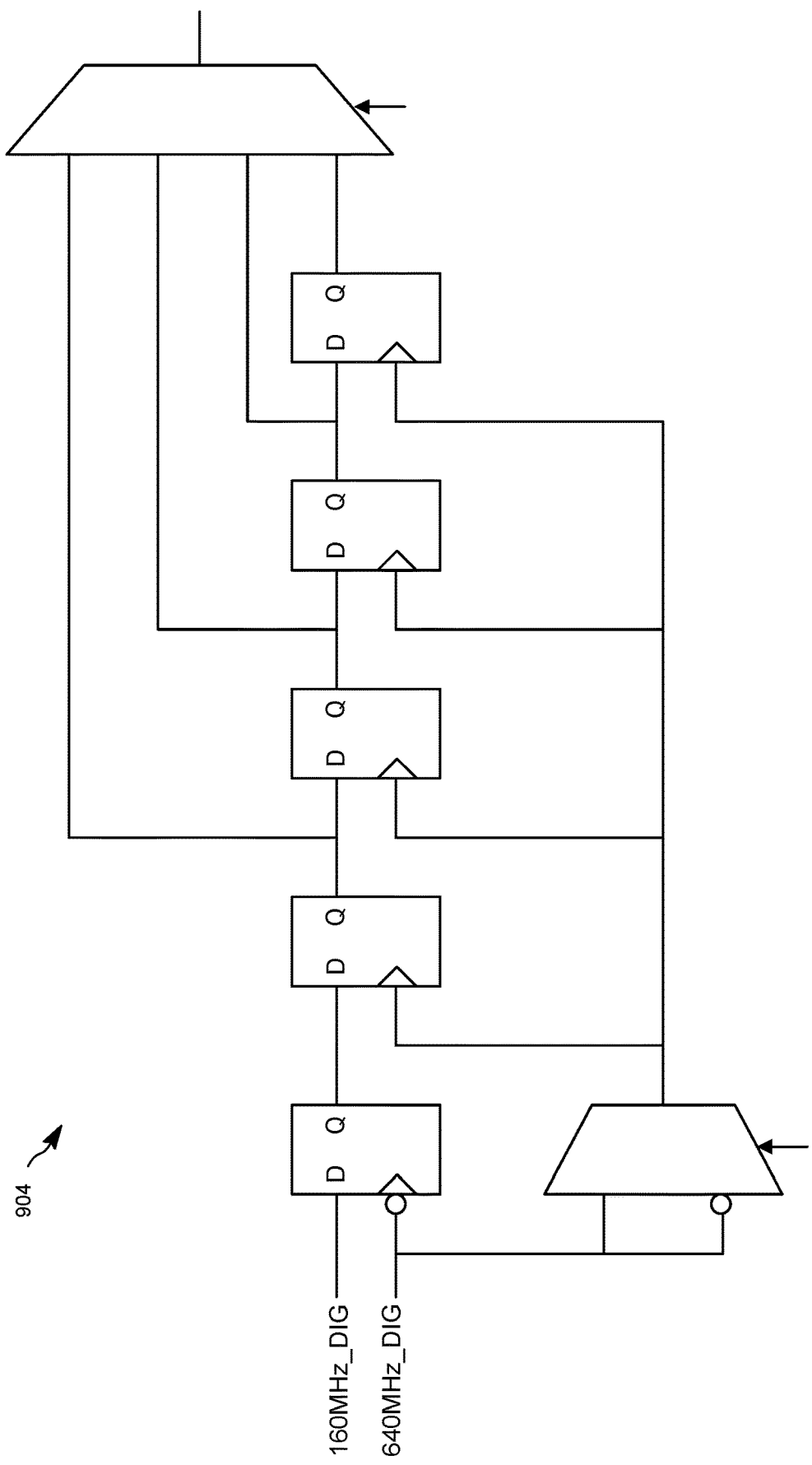
FIG. 15 is a first example circuit implementation of the tunable eight-phase logic circuit of FIG. 14, in accordance with some embodiments.
Figure 16:
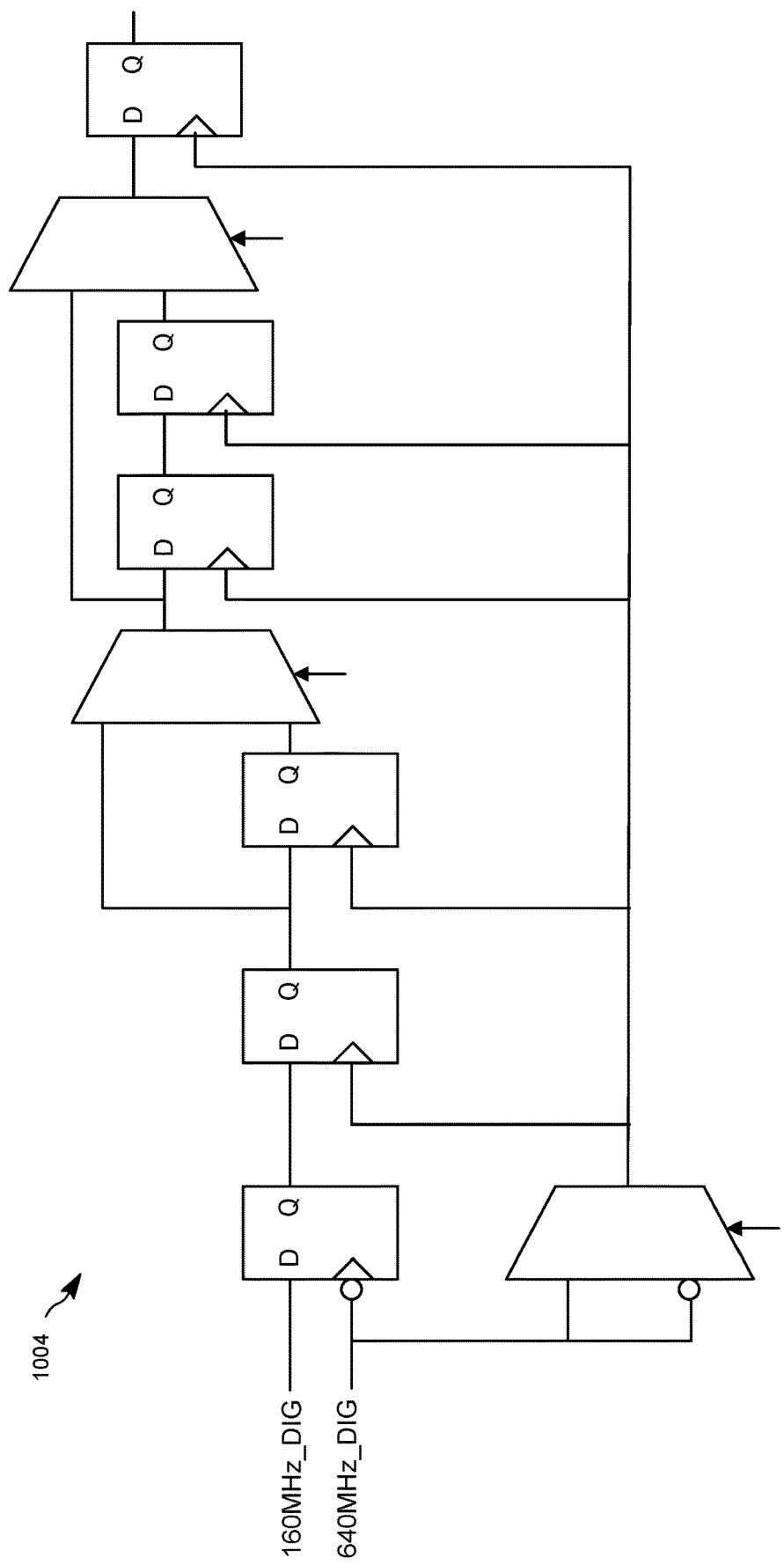
FIG. 16 is a second example circuit implementation of the tunable eight-phase logic circuit of FIG. 14, in accordance with some embodiments.

FIG. 15 is a first example circuit implementation 904 of the tunable eight-phase logic circuit 804, 806 of FIG. 14, in accordance with some embodiments. FIG. 16 is a second example circuit implementation 1004 of the tunable eight-phase logic circuit 804, 806 of FIG. 14, in accordance with some embodiments. In general, each of these example circuit implementations 904, 1004 of the tunable eight-phase logic circuit 804, 806 of FIG. 14 includes a series of D flip-flops cascaded together. The example implementation 904 of FIG. 15 includes five D flip-flops, one 2-to-1 multiplexer, and one 4-to-1 multiplexer, while the example implementation 1004 of FIG. 16 includes six D flip-flops and three 2-to-1 multiplexers. Each tunable eight-phase logic circuit 804 (904 and 1004 in FIG. 15 and FIG. 16, respectively) provides (e.g.) eight separate 160 MHz outputs, selectable by a three-bit control signal (provided across two MUXes in FIG. 15 and three MUXes in FIG. 16).

Figure 17:
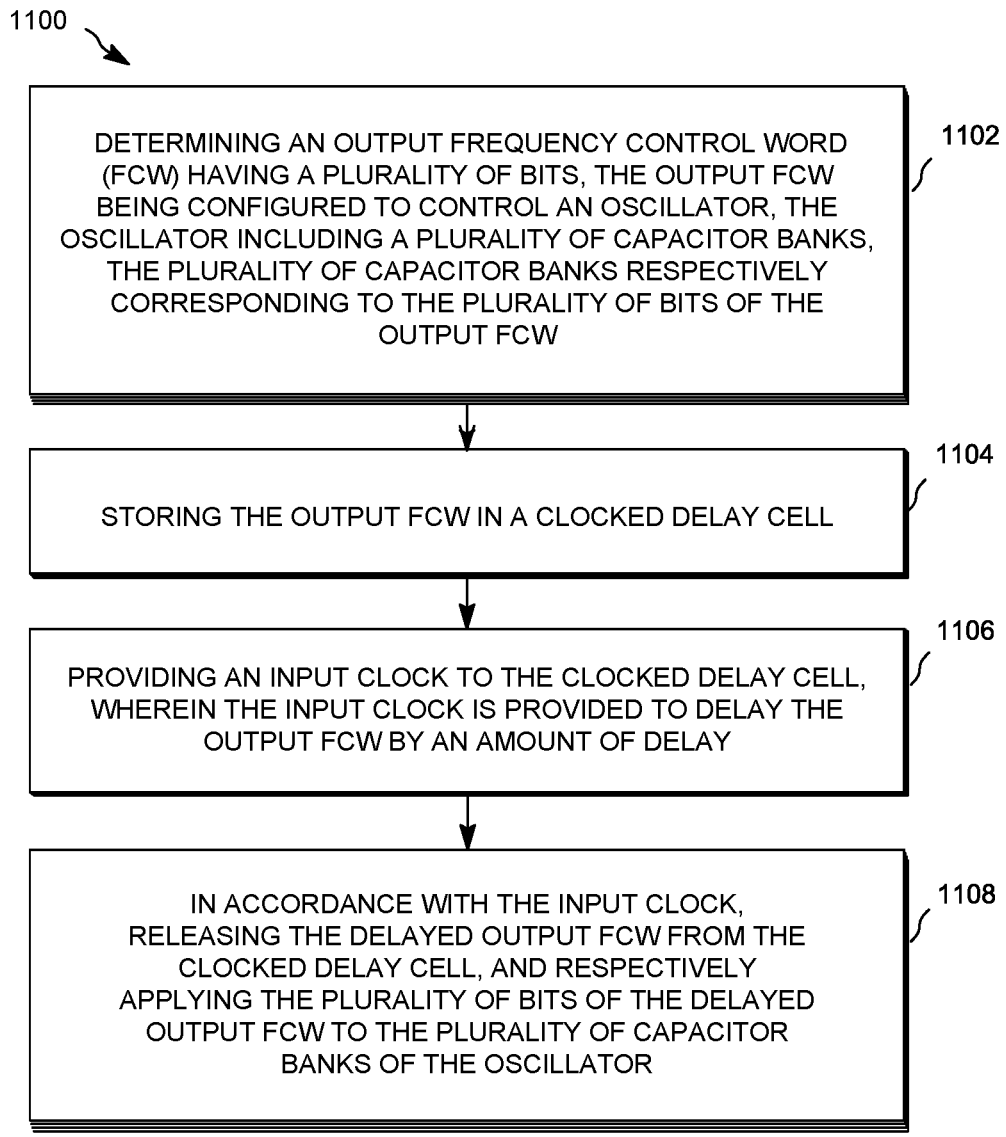
FIG. 17 is a flow diagram illustrating an example method, in accordance with some embodiments.

FIG. 17 is a flow diagram illustrating an example method 1100, in accordance with some embodiments. The example method 1100 includes, in some embodiments: at 1102, determining an output frequency control word (FCW) having a plurality of bits, the output FCW being configured to control an oscillator, the oscillator including a plurality of capacitor banks, the plurality of capacitor banks respectively corresponding to the plurality of bits of the output FCW; at 1104, storing the output FCW in a clocked delay cell; at 1106, providing an input clock to the clocked delay cell, wherein the input clock is provided to delay the output FCW by an amount of delay; and, at 1108, in accordance with the input clock, releasing the delayed output FCW from the clocked delay cell, and respectively applying the plurality of bits of the delayed output FCW to the plurality of capacitor banks of the oscillator.

In some embodiments, the oscillator may be part of a phase-locked loop circuit. In some embodiments, the clocked delay cell may temporarily store successive values of the output FCW as each successive current value is passed, e.g., one by one, from prior processing through to the oscillator. The clocked delay cell may include a series of D flip-flops. The amount of delay may be based on a clock period of the input clock minus an estimated loop delay in a portion of a phase-locked loop circuit that, e.g., include the oscillator.

Figure 18:
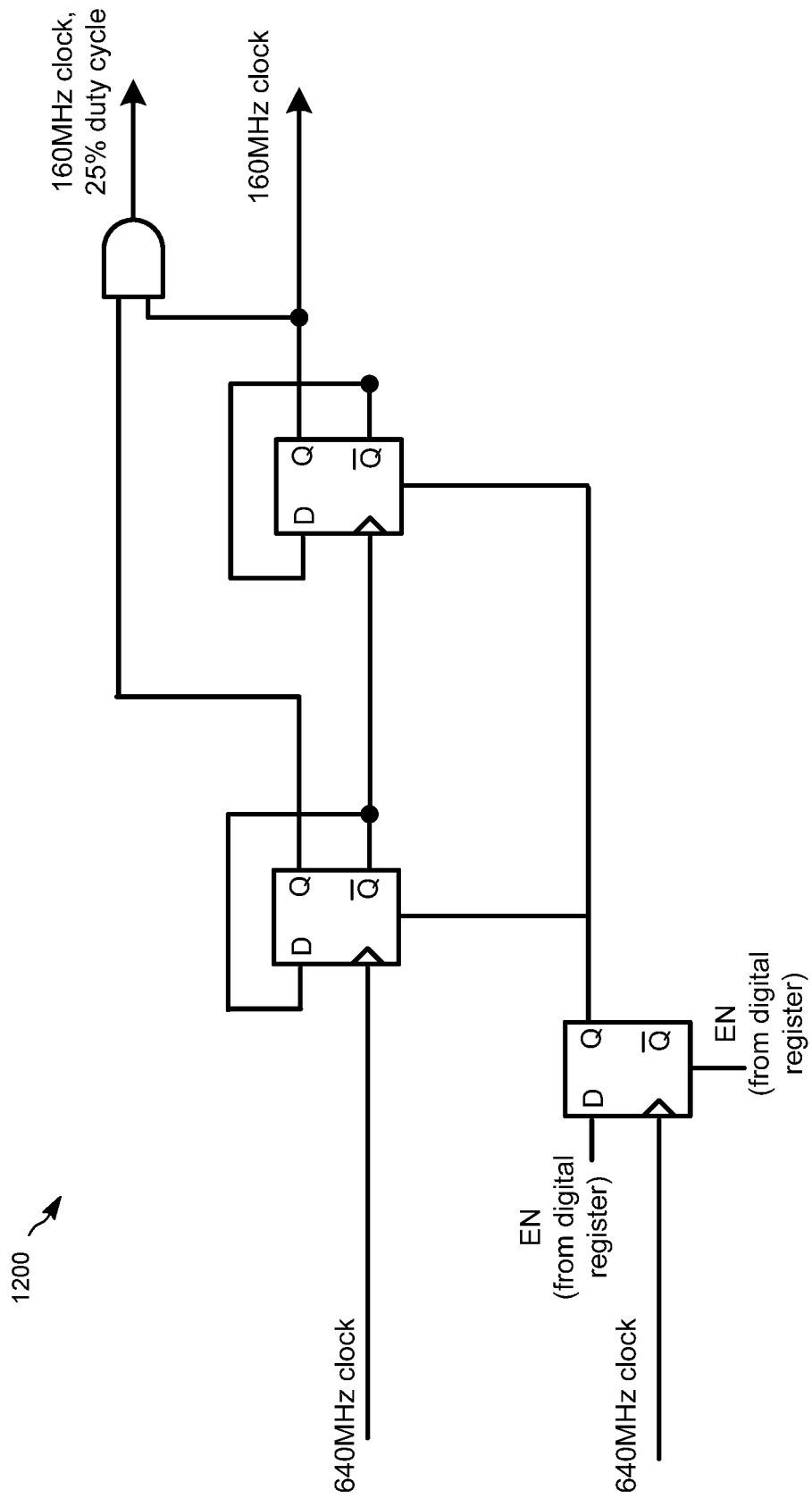
FIG. 18 is an example circuit implementation of the divide-by-four circuit of FIG. 14, in accordance with some embodiments.

FIG. 18 is an example circuit implementation 1200 of the divide-by-four circuit 802 of FIG. 14, in accordance with some embodiments.

In accordance with some embodiments, in a two point injection modulator having a frequency control input and a phase control input, a frequency control data word input is delayed a fraction of a sampling interval before being applied to the VCO (typically one or more capacitor banks that adjust an oscillation frequency). Because the delay from the digital input of the frequency word to the measured phase output of the VCO is a non-integer number of sampling times, a fractional sample interval delay is added such that the measured phase is then substantially aligned to an integer number of sample intervals, thereby allowing a more accurate phase error measurement. The fractional delay is a portion of a sampling interval, so that when it is combined with a fractional delay associated with an analog signal processing delay, the measured phase is accurate, and thus a phase error can be accurately calculated. Note that the phase signal used to generate the error may be delayed by some number of samples for complete alignment. The amount of the fractional delay may be adjusted while the modulator performance is monitored, and the amount of delay is set to obtain a desired performance. In accordance with some embodiments, adjustment and testing may be performed off-line, perhaps as, e.g., a one-time factory calibration, and may include a temperature-dependent lookup table.

In some embodiments, an FCW may be generated by some process (e.g., from a linearization process) to control an oscillator. The FCW may delayed or, e.g., temporarily stored at a clocked delay cell such as a set of D flip-flops (DFFs), although other delay elements may be used. The delay of the FCW may be used, e.g., to compensate for an analog loop delay in the DPLL.

In some embodiments, the FCW may be delayed by a remaining amount of a clock cycle on an analog signal processing loop delay is subtracted from the clock cycle. This may permit the FCW to include an aligned result (aligned with the system clock cycle) of the error signal/filtered output from a TDC and (e.g., differentiated) baseband phase samples.

In some embodiments, a delay compensation cell such as an interpolator may be used to delay initial FCWs from a differentiator by the measured amount of an analog loop delay, so that an input FCW from the delay compensation cell arrives at, e.g., a linearization circuit at generally the same time as an error signal/filtered output from the TDC.

In some embodiments, the "input clock" used to "clock/release" the temporarily stored FCW may be based on a modified system clock.

In some embodiments, a multiplexer may be configured to provide a selected modified system clock from a plurality of modified system clock options. In some embodiments, the modified system clock options may include any of, e.g., a system clock (for the DPLL) provided to a delay cell, the delay cell configured to set a delay for the system clock; the system clock (for the DPLL) itself; a clock provided from a tunable 8 phase clock circuit, wherein the clock is distributed from elsewhere on the chip; a clock provided from a tunable 8 phase clock circuit, wherein the tunable 8 phase clock circuit and thus the clock are local to the DPLL (and do not require distribution from elsewhere on the chip).

In some embodiments, a delay compensation cell (that includes a linear interpolator) (e.g., prior to the DCO linearizer) may be used to interpolate between frequency samples (e.g., initial FCWs). The delay compensation cell may be used in conjunction with the selected modified system clock to provide fine tuning of the clocking/release of the FCW from the clocked delay cell into the oscillator.

An example method in accordance with some embodiments may include: determining an output frequency control word (FCW) having a plurality of bits, the output FCW being configured to control an oscillator of a phase-locked loop circuit, the oscillator comprising a plurality of capacitor banks, the plurality of capacitor banks respectively corresponding to the plurality of bits of the output FCW. The example method may further include storing the output FCW in a clocked delay cell, wherein the clocked delay cell comprises a series of D flip-flops. The example method may further include providing an input clock to the clocked delay cell, wherein the input clock is provided to delay the output FCW by an amount of delay based on a clock period of the input clock minus an estimated loop delay in a portion of the phase-locked loop circuit. The example method may further include, in accordance with the input clock, releasing the delayed output FCW from the clocked delay cell, and respectively applying the plurality of bits of the delayed output FCW to the plurality of capacitor banks of the oscillator.

In some embodiments, the input clock is provided to the clocked delay cell such that an input phase and an error correction signal (e.g., a phase error signal generated based on an output signal of the oscillator) are ultimately aligned in time in contributing to the output FCW and to ensure that the output FCW is provided to the DCO on a clock transition of the input clock.

In some embodiments, providing the input clock (e.g., to the clocked delay cell) may include providing a modified system clock as the input clock.

In some embodiments, the modified system clock may include a system clock designed for the phase-locked loop circuit.

In some embodiments, the modified system clock may include a delayed system clock provided from a second delay cell. The second delay cell may be configured to apply a second delay to a system clock designed for the phase-locked loop.

In some embodiments, the modified system clock may include a selected system clock provided from a tunable multi-phase circuit.

In some embodiments, the tunable multi-phase circuit is local to the phase-locked loop circuit and the selected system clock is provided from the tunable multi-phase circuit from a system clock.

In some embodiments, the tunable multi-phase circuit is located remotely from the phase-locked loop circuit and the selected system clock is provided from the tunable multi-phase circuit locally to a system clock and the selected system clock is distributed across a chip to the phase-locked loop circuit.

In some embodiments, providing the input clock may include providing a selected modified system clock as the input clock from a plurality of modified system clock options.

In some embodiments, the plurality of modified system clock options may include two or more of: a system clock designed for the phase-locked loop circuit, a delayed system clock provided from a second delay cell, the second delay cell configured to apply a second delay to the system clock designed for the phase-locked loop circuit, a first selected system clock provided from a first tunable multi-phase circuit, wherein the first tunable multi-phase circuit is local to the phase-locked loop circuit, and a second selected system clock provided from a second tunable multi-phase circuit, wherein the second tunable multi-phase circuit is located remotely from the phase-locked loop circuit and the selected system clock is distributed across a chip to the phase-locked loop circuit.

In some embodiments, determining the output FCW may include receiving an input FCW and responsively providing the output FCW.

In some embodiments, receiving the input FCW may further include determining the input FCW by interpolating between successive values of an initial input FCW.

In some embodiments, receiving the input FCW and responsively providing the output FCW may further include receiving the input FCW and responsively providing the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

In some embodiments, determining the output FCW may further include determining the plurality of sensitivity characteristics by determining, for each capacitor bank of the plurality of capacitor banks of the oscillator, a respective sensitivity characteristic of the capacitor bank; and determining the set of reference output FCWs for an associated set of frequencies of the oscillator.

In some embodiments, the respective sensitivity characteristic of the capacitor bank may indicate a change in a frequency of the oscillator that occurs as a result of an incremental addition of each capacitor in the capacitor bank.

In some embodiments, determining, for each capacitor bank of the plurality of capacitor banks of the oscillator, the respective sensitivity characteristic of the capacitor bank may include: measuring first and second frequencies of the oscillator by turning on (i) a first number of capacitors in the capacitor bank to measure the first frequency and (ii) a second number of capacitors in the capacitor bank to measure the second frequency; and determining the respective sensitivity characteristic of the capacitor bank based on a difference between the first and second frequencies and a difference between the first and second number of capacitors.

In some embodiments, determining the set of reference FCWs for the associated set of frequencies of the oscillator may include: selecting a number of desired frequencies of the oscillator; and, for each desired frequency of the oscillator, providing an initial FCW to the oscillator and thereafter adjusting the initial FCW by selectively setting capacitance values of the at least two capacitor banks of the oscillator so as to cause the oscillator to generate approximately the desired frequency; and setting the adjusted initial FCW as a reference output FCW associated with the desired frequency.

An example circuit in accordance with some embodiments may include an oscillator circuit, a frequency control word (FCW) processing circuit, a clocked delay cell, and an input clock selection circuit. In some embodiments, the oscillator circuit may include a tank circuit having a plurality of capacitor banks. In some embodiments, the FCW processing circuit may be configured to determine an output FCW having a plurality of bits, the output FCW being configured to control the oscillator of a phase-locked loop circuit, wherein the plurality of capacitor banks of the oscillator respectively correspond to the plurality of bits of the output FCW. In some embodiments, the clocked delay cell may be configured to store the output FCW, wherein the clocked delay cell comprises a series of D flip-flops. In some embodiments, the input clock selection circuit configured to provide an input clock to the clocked delay cell, wherein the input clock is provided to delay the output FCW by an amount of delay based on a clock period of the input clock minus an estimated loop delay in a portion of the phase-locked loop circuit. In some embodiments, the clocked delay cell may be further configured to, in accordance with the input clock, release the delayed output FCW from the clocked delay cell and respectively apply the plurality of bits of the delayed output FCW to the plurality of capacitor banks of the oscillator.

In some embodiments, the input clock selection circuit may include a multiplexer circuit. The multiplexer circuit may be configured to provide, from one or more modified system clock options, a selected modified system clock as the input clock to the clocked delay cell. The multiplexer circuit may be configured to receive a selection of the modified system clock at a select input of the multiplexer circuit.

In some embodiments, the FCW processing circuit may include a linearization circuit. The linearization circuit may be coupled to the clocked delay cell. In some embodiments, the linearization circuit may be operative to receive an input FCW and responsively provide the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

In some embodiments, the example circuit may further include a delay compensation cell configured to determine the input FCW by interpolating between successive values of an initial input FCW.

EXAMPLE EMBODIMENTS

The following are example embodiments, not claims.

A1. A method of linearizing a frequency response of an oscillator controlled by a plurality of capacitor banks, comprising:
determining, for each capacitor bank of at least two capacitor banks of the oscillator, a respective sensitivity characteristic of the capacitor bank;
determining a set of reference output frequency control words (FCWs) for an associated set of frequencies of the oscillator;
receiving an input FCW and responsively providing an output FCW based on (i) an interpolation between two reference output FCWs of the set of reference output FCWs and (ii) the respective sensitivity characteristics of the at least two capacitor banks of the oscillator; and, applying the output FCW to the at least two capacitor banks of the oscillator.

A2. The method of claim A1, wherein the respective sensitivity characteristic of the capacitor bank indicates a change in a frequency of the oscillator that occurs as a result of an incremental addition of each capacitor in the capacitor bank.

A3. The method of claim A1, wherein:
each of the plurality of capacitor banks comprises a respective plurality of capacitors, and a respective set of bits of the output FCW is used to selectively control the plurality of capacitors of the capacitor bank.

A4. The method of claim A1, wherein:
the output FCW applied to the at least two capacitor banks of the oscillator comprises a first set of bits corresponding to the most significant bits of an interpolated output FCW and at least one second set of bits determined using a remainder of bits of the interpolated output FCW.

A5. The method of claim A4, wherein each second set of bits corresponds to a set of bits obtained by at least scaling the remainder of bits of the interpolated output FCW in accordance with sensitivity characteristics of respective capacitor banks of the at least two capacitor banks.

A6. The method of claim A5, wherein a given second set of bits is based on (i) a set of bits obtained by scaling the remainder of bits of the interpolated output FCW in accordance with sensitivity characteristics of respective capacitor banks of the at least two capacitor banks and (ii) a phase error signal generated based on an output signal of the oscillator.

A7. The method of claim A4, wherein the most significant bits of the interpolated output FCW are multiple bits used to change a capacitance of a given capacitor bank from among the at least two capacitor banks that includes largest-sized capacitors.

A8. The method of claim A4, wherein the most significant bits correspond to the most significant bits of the interpolated output FCW that are further quantized.

A9. The method of claim A6, wherein:
the at least two capacitor banks of the oscillator are a first capacitor bank and a second capacitor bank,
the output FCW applied to the at least two capacitor banks of the oscillator comprises a first set of bits corresponding to the most significant bits of the interpolated output FCW and a second set of bits corresponding to the least significant bits of the interpolated output FCW that are at least scaled by a ratio of respective sensitivity characteristics of
the first capacitor bank and the second capacitor bank,
the first set of bits is applied to the first capacitor bank, and
the second set of bits is applied to the second capacitor bank.

A10. The method of claim A9, wherein:
the first set of bits corresponding to the most significant bits of the interpolated output FCW is quantized prior to the first set of bits being applied to the first capacitor bank, and a phase error signal generated based on an output signal of the oscillator is added to the scaled second set of bits prior to the second set of bits being applied to the first capacitor bank.

A11. The method of claim A9, wherein;
the first capacitor bank comprises a first plurality of capacitors,
the second capacitor bank comprises a second plurality of capacitors,
the most significant bits of the interpolated output FCW are bits used to selectively control the first plurality of capacitors of the first capacitor bank, each of the first plurality of capacitors having a capacitance value larger than a capacitance value of each of the second plurality of capacitors of the second capacitor bank, and
the least significant bits of the interpolated output FCW are the remainder of bits of the interpolated output FCW that are scaled by the ratio to selectively control the second plurality of capacitors of the second capacitor bank.

A12. The method of claim A1, wherein determining, for each capacitor bank of the at least two capacitor banks of the oscillator, the respective sensitivity characteristic of the capacitor bank comprises:
measuring first and second frequencies of the oscillator by turning on (i) a first number of capacitors in the capacitor bank to measure the first frequency and (ii) a second number of capacitors in the capacitor bank to measure the second frequency; and
determining the respective sensitivity characteristic of the capacitor bank based on a difference between the first and second frequencies and a difference between the first and second number of capacitors.

A13. The method of claim A1, wherein determining the set of reference FCWs for the associated set of frequencies of the oscillator comprises:
selecting a number of desired frequencies of the oscillator;
for each desired frequency of the oscillator:
providing an initial FCW to the oscillator and thereafter adjusting the initial FCW by selectively setting capacitance values of the at least two capacitor banks of the oscillator so as to cause the oscillator to generate approximately the desired frequency; and setting the adjusted initial FCW as a reference output FCW associated with the desired frequency.

A14. The method of claim A1, wherein each of the reference output FCW, the input FCW, and the output FCW is 18-bit long.

B15. A circuit comprising:
an oscillator circuit, wherein the oscillator circuit includes a tank circuit having a plurality of capacitor banks, wherein each capacitor bank of at least two capacitor banks of the oscillator has a respective sensitivity characteristic; and
a linearization circuit coupled to the oscillator circuit, wherein the linearization circuit is operative to:
generate a set of reference output frequency control words (FCWs) for an associated set of frequencies,
receive an input FCW and responsively generate an output FCW based on (i) an interpolation between two reference output FCWs of the set of reference output FCWs and (ii) the respective sensitivity characteristics of the at least two capacitor banks, and generate an output FCW to be applied to the at least two capacitor banks of the oscillator, the at least two capacitor banks of the oscillator being digitally controlled in accordance with the output FCW, wherein the oscillator is further operative to receive the output FCW and generate an output signal with a frequency corresponding to the output FCW.

B16. The circuit of claim B15, wherein:
each capacitor bank of the at least two capacitor banks includes a respective plurality of capacitors that are each of a given capacitance size, and the given capacitance size varies from one capacitor bank to another capacitor bank.

B17. The circuit of claim B15, wherein the respective sensitivity characteristic of the capacitor bank indicates a change in a frequency of the oscillator that occurs as a result of an incremental addition of each capacitor in the capacitor bank.

B18. The circuit of claim B15, wherein:
the output FCW applied to the at least two capacitor banks of the oscillator comprises a first set of bits corresponding to the most significant bits of an interpolated output FCW and at least one second set of bits determined using a remainder of bits of the interpolated output FCW.

B19. The circuit of claim B18, wherein each second set of bits corresponds to a set of bits obtained by scaling the remainder of bits of the interpolated output FCW in accordance with sensitivity characteristics of respective capacitor banks of the at least two capacitor banks.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method, comprising:
determining an output frequency control word (FCW) having a plurality of bits, the output FCW being configured to control an oscillator of a phase-locked loop circuit, the oscillator comprising a plurality of capacitor banks, the plurality of capacitor banks respectively corresponding to the plurality of bits of the output FCW;
storing the output FCW in a clocked delay cell, wherein the clocked delay cell comprises a series of D flip-flops;
providing an input clock to the clocked delay cell, wherein the input clock is provided to delay the output FCW by an amount of delay based on a clock period of the input clock minus an estimated loop delay in a portion of the phase-locked loop circuit; and
in accordance with the input clock, releasing the delayed output FCW from the clocked delay cell, and respectively applying the plurality of bits of the delayed output FCW to the plurality of capacitor banks of the oscillator.

2. The method of claim 1, wherein providing the input clock comprises:
providing a modified system clock as the input clock.

3. The method of claim 2, wherein the modified system clock comprises:
a system clock designed for the phase-locked loop circuit.

4. The method of claim 2, wherein the modified system clock comprises:
   a delayed system clock provided from a second delay cell, the second delay cell configured to apply a second delay to a system clock designed for the phase-locked loop.

5. The method of claim 2, wherein the modified system clock comprises:
   a selected system clock provided from a tunable multi-phase circuit.

6. The method of claim 5, wherein the tunable multi-phase circuit is local to the phase-locked loop circuit and the selected system clock is provided from the tunable multi-phase circuit from a system clock.

7. The method of claim 5, wherein the tunable multi-phase circuit is located remotely from the phase-locked loop circuit and the selected system clock is provided from the tunable multi-phase circuit locally to a system clock and the selected system clock is distributed across a chip to the phase-locked loop circuit.

8. The method of claim 1, wherein providing the input clock comprises:
   providing a selected modified system clock as the input clock from a plurality of modified system clock options.

9. The method of claim 8, wherein the plurality of modified system clock options comprises two or more of:
   a system clock designed for the phase-locked loop circuit,
   a delayed system clock provided from a second delay cell, the second delay cell configured to apply a second delay to the system clock designed for the phase-locked loop circuit,
   a first selected system clock provided from a first tunable multi-phase circuit, wherein the first tunable multi-phase circuit is local to the phase-locked loop circuit, and
   a second selected system clock provided from a second tunable multi-phase circuit, wherein the second tunable multi-phase circuit is located remotely from the phase-locked loop circuit and the selected system clock is distributed across a chip to the phase-locked loop circuit.

10. The method of claim 1, wherein determining the output FCW comprises:
    receiving an input FCW and responsively providing the output FCW.

11. The method of claim 10, wherein receiving the input FCW further comprises:
    determining the input FCW by interpolating between successive values of an initial input FCW.

12. The method of claim 10, wherein receiving the input FCW and responsively providing the output FCW further comprises:
    receiving the input FCW and responsively providing the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

13. The method of claim 12, wherein determining the output FCW further comprises:
    determining the plurality of sensitivity characteristics by determining, for each capacitor bank of the plurality of capacitor banks of the oscillator, a respective sensitivity characteristic of the capacitor bank; and
    determining the set of reference output FCWs for an associated set of frequencies of the oscillator.

14. The method of claim 13, wherein the respective sensitivity characteristic of the capacitor bank indicates a change in a frequency of the oscillator that occurs as a result of an incremental addition of each capacitor in the capacitor bank.

15. The method of claim 13, wherein determining, for each capacitor bank of the plurality of capacitor banks of the oscillator, the respective sensitivity characteristic of the capacitor bank comprises:
    measuring first and second frequencies of the oscillator by turning on (i) a first number of capacitors in the capacitor bank to measure the first frequency and (ii) a second number of capacitors in the capacitor bank to measure the second frequency; and
    determining the respective sensitivity characteristic of the capacitor bank based on a difference between the first and second frequencies and a difference between the first and second number of capacitors.

16. The method of claim 13, wherein determining the set of reference FCWs for the associated set of frequencies of the oscillator comprises:
    selecting a number of desired frequencies of the oscillator; and
    for each desired frequency of the oscillator:
        providing an initial FCW to the oscillator and thereafter adjusting the initial FCW by selectively setting capacitance values of the at least two capacitor banks of the oscillator so as to cause the oscillator to generate approximately the desired frequency; and
        setting the adjusted initial FCW as a reference output FCW associated with the desired frequency.

17. A circuit comprising:
    an oscillator circuit, wherein the oscillator circuit includes a tank circuit having a plurality of capacitor banks; and
    a frequency control word (FCW) processing circuit configured to determine an output FCW having a plurality of bits, the output FCW being configured to control the oscillator of a phase-locked loop circuit, wherein the plurality of capacitor banks of the oscillator respectively correspond to the plurality of bits of the output FCW;
    a clocked delay cell configured to store the output FCW, wherein the clocked delay cell comprises a series of D flip-flops; and
    an input clock selection circuit configured to provide an input clock to the clocked delay cell, wherein the input clock is provided to delay the output FCW by an amount of delay based on a clock period of the input clock minus an estimated loop delay in a portion of the phase-locked loop circuit;
    wherein the clocked delay cell is further configured to, in accordance with the input clock, release the delayed output FCW from the clocked delay cell and respectively apply the plurality of bits of the delayed output FCW to the plurality of capacitor banks of the oscillator.

18. The circuit of claim 17, wherein the input clock selection circuit comprises:
    a multiplexer circuit configured to provide, from one or more modified system clock options, a selected modified system clock as the input clock to the clocked delay cell, the multiplexer circuit configured to receive a selection of the modified system clock at a select input of the multiplexer circuit.

19. The circuit of claim 17, wherein the FCW processing circuit comprises:
   a linearization circuit coupled to the clocked delay cell, wherein the linearization circuit is operative to receive an input FCW and responsively provide the output FCW based on (i) an interpolation between two reference output FCWs of a set of reference output FCWs and (ii) a sensitivity characteristic of a plurality of sensitivity characteristics respectively corresponding to the plurality of capacitor banks of the oscillator.

20. The circuit of claim 19, further comprising:
   a delay compensation cell configured to determine the input FCW by interpolating between successive values of an initial input FCW.

\* \* \* \* \*